(12) United States Patent
Sakurai et al.

(10) Patent No.: US 6,310,282 B1
(45) Date of Patent: Oct. 30, 2001

(54) PHOTOVOLTAIC CONVERSION ELEMENT AND A DYE-SENSITIZING PHOTOVOLTAIC CELL

(75) Inventors: Masatoshi Sakurai; Katsuyuki Naito, both of Tokyo; Akihiro Horiguchi, Fujisawa; Hiroyasu Sumino, Tokyo; Maki Yonetsu, Yokohama, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/527,521

(22) Filed: Mar. 16, 2000

(30) Foreign Application Priority Data

Mar. 19, 1999 (JP) .................................................. 11-074845

(51) Int. Cl.⁷ ........................ H01L 31/103; H01L 31/18; H01L 31/055; H01M 14/00
(52) U.S. Cl. ........................ 136/263; 136/255; 136/256; 136/249; 257/440; 257/461; 257/432; 257/40; 429/111
(58) Field of Search .................................... 136/263, 255, 136/256, 249 TJ; 257/440, 461, 432, 40; 429/111

(56) References Cited

U.S. PATENT DOCUMENTS

| | | | |
|---|---|---|---|
| 4,927,721 | * 5/1990 | Gratzel et al. | 429/111 |
| 5,350,644 | * 9/1994 | Graetzel et al. | 429/111 |
| 5,885,368 | * 3/1999 | Lupo et al. | 136/263 |
| 6,084,176 | * 7/2000 | Shiratsuchi et al. | 136/263 |
| 6,150,605 | * 11/2000 | Han | 136/263 |

FOREIGN PATENT DOCUMENTS

WO 94/05025 * 3/1994 (WO) .

OTHER PUBLICATIONS

Brian O'Regan, et al., "A Low-Cost, High-Efficiency Solar Cell Based On Dye-Sensitized Colloidal $TiO_2$ Films," Nature, vol. 353, Oct. 24, 1991, pp. 737–739.

John N. Bullock, et al., "Semi-Transparent a-SiC:H Solar Cells for Self-Powered Photovoltaic-Electrochromic Devices," Journal of Non-Crystalline Solids, vol. 198–200, 1996, pp. 1163–1167.

D. Knipp, et al., "Four Terminal Color Detector for Digital Signal Processing," Journal of Non-Crystalline Solids, vol. 227–230, 1998, pp. 1321–1325.

* cited by examiner

Primary Examiner—Alan Diamond
(74) Attorney, Agent, or Firm—Oblon, Spivak, McClelland, Maier & Neustadt, P.C.

(57) ABSTRACT

A photovoltaic conversion element comprising, a first transparent electrode, a transparent semiconductor layer disposed on the first transparent electrode, a sensitizing dye adsorption portion which is disposed on the surface of the transparent semiconductor layer, a carrier transport layer formed on the sensitizing dye adsorption portion, and a second transparent electrode disposed on the carrier transport layer, wherein the sensitizing dye adsorption portion comprises sensitizing dyes of plural kinds of color, which are adsorbed on a plurality of surface regions of the semiconductor layer.

22 Claims, 6 Drawing Sheets

PHOTOVOLTAIC CONVERSION ELEMENT AND A DYE-SENSITIZING PHOTOVOLTAIC CELL

BACKGROUND OF THE INVENTION

This invention relates to a photovoltaic conversion element (device) and a dye-sensitizing type photovoltaic cell.

The electric power for actuating a display element (device) which is employed extensively for various end-use now is currently supplied by a battery or cell disposed outside the display element. For example, in the case of a liquid crystal display element, the power is supplied by a cell disposed outside the liquid crystal display element. Therefore, the operating time of such a liquid crystal display is restricted by the life of cell.

If it is desired to extend the operating time of a display element, the employment of solar cell as a power source is effective. However, when the solar cell is to be employed, a light-receiving portion of the solar cell is required to be disposed outside the display element, thereby enlarging the size of the display element.

In view of preventing the display element from being enlarged, there has been proposed to form a solar cell inside the display element. For example, Japanese Patent No. 2728041 describes a method wherein an opaque solar cell such as one comprising Si is disposed at a light-shielding portion of a liquid crystal display element. According to this method however, since it is impossible to secure a wide light-receiving area at the light-shielding portion, it is difficult to supply a sufficient energy to the display element. There is also proposed a method wherein an opaque solar cell is employed as a light absorption layer of liquid crystal display element so as to employ the solar cell as an energy source for actuating the display element (Japanese Patent Unexamined Publication H8-152620). In this case however, since the light absorption layer is placed underneath the liquid crystal layer, the light is shielded by the liquid crystal layer, so that it is also difficult as in the case of the aforementioned method to supply a sufficient energy to the display element.

Further, there is also proposed another method for forming a solar cell inside the display element, wherein a light-transmitting solar cell is formed on the surface of display element. As for a solar cell which is capable of transmitting light, there are known a back surface transparent electrode type solar cell wherein an amorphous silicon solar cell is disposed on a glass substrate, a see-through solar cell wherein fine holes are formed in a silicon substrate thereby allowing light to pass therethrough, or a dye-sensitizing type solar cell. However, since the aforementioned back surface transparent electrode type solar cell is accompanied with the problem that the colors are restricted by the bandgap of silicon, a display element provided with the solar cell is incapable of displaying colors other than red, e.g. blue and green. On the other hand, since the light transmittance is secured by the fine holes in the case of the see-through solar cell, it is impossible to enhance the light transmittance in simultaneous with the enhancement of the supply of energy.

The dye-sensitizing type solar cell is, as described in Japanese Patent No. 2664194 for instance, composed of a first transparent electrode, a transparent semiconductor disposed on the first transparent electrode, a sensitizing dye which is adsorbed on the surface of the transparent semiconductor, a carrier layer formed on the sensitizing dye, and a second transparent electrode disposed over the carrier layer. This dye-sensitizing type solar cell can be operated through the following process.

The light entering the solar cell is allowed to pass through the first transparent electrode and the transparent semiconductor for instance, thus reaching the sensitizing dye. Alternatively, the light entering the solar cell is allowed to pass through the second transparent electrode and the carrier layer, thus reaching the sensitizing dye. Subsequently, this sensitizing dye is excited by the light, thereby generating electrons at the LUMO level and holes at the HOMO level. The electrons of LUMO level of the sensitizing dye that have been generated by the excitation are immediately transferred to the conduction band of the transparent semiconductor, subsequently reaching the first transparent electrode. On the other hand, the residual holes of HOMO level of the sensitizing dye receive electrons from the carrier transport layer, thereby neutralizing the sensitizing dye.

Since the electrons have been delivered, ions or holes are caused to generate in the carrier transport layer. The ions or holes thus generated are allowed to diffuse into the carrier transport layer, thereby reaching the second transparent electrode, thus receiving electrons from the second transparent electrode. The first transparent electrode that has received the electrons functions as a negative electrode, and the second transparent electrode that has handed over the electrons functions as a positive electrode, thereby enabling them to function as a dye-sensitizing type solar cell.

However, according to the conventional dye-sensitizing type solar cell, since only one kind of dye is employed for each of the transparent semiconductor, the external appearance is formed of a single color glass as in the case of the back surface transparent electrode type solar cell. Therefore, it is impossible, in this dye-sensitizing type solar cell, to display a plural kinds of color, so that it is impossible to dispose the dye-sensitizing type solar cell at the interior of display element.

By the way, in the case of a photovoltaic cell using an electrode carrying a dye on the surface of transparent semiconductor layer, a semiconductor electrode having a fine structure which can be obtained by sintering metal oxide fine particles is employed as set forth in Japanese Patent Unexamined Publication H1-220380 or International Patent Publication H5-504023.

In the manufacture of a semiconductor electrode that has been employed for a photovoltaic cell wherein a titanium oxide film is to be employed for instance, first of all, an electrode is dipped into a solvent containing an organic titanium compound such as titanium isopropoxide. Then, after being taken out of the solvent, the electrode is sintered to obtain a semiconductor film. The semiconductor film thus obtained is treated so as to allow a dye to be adsorbed on the surface thereof, and then, interposed between counter electrodes via a liquid carrier transport layer, thereby obtaining a wet type photovoltaic cell.

This photovoltaic cell obtained in this manner can be operated through the aforementioned transfer of electrons and holes. The electromotive force between these electrodes is generated in a magnitude which is reduced by a loss to be brought about as carriers is migrated from the HOMO-LUMO gap of the sensitizing dye to the electrode via the semiconductor layer and the carrier transport layer.

In the case of the conventional photoelectric cell, a semiconductor electrode formed using an n-type semiconductor having a sensitizing dye adsorbed thereon has been employed as a negative electrode, while a metal electrode has been predominantly employed as a positive electrode.

Therefore, the electromotive force to be generated within the photovoltaic cell would not exceed over the HOMO-LUMO level of the sensitizing dye of one kind. Thus, the photovoltaic conversion element using only a single band gap or HOMO-LUMO level is limited in photovoltaic conversion efficiency, making it impossible to further improve the photovoltaic conversion efficiency.

On the other hand, the photovoltaic cell comprising a liquid electrolyte as a carrier transport layer is accompanied with a problem of the leakage of electrolyte. Although it is possible to prevent the leakage by using a gel or a solid polymer for the carrier transport layer, since such a gel or a solid polymer is poor in ion conductivity as compared with an electrolyte, the photovoltaic conversion efficiency of the cell would be decreased as compared with that where an electrolyte is employed.

Under the circumstances, it is now desired to develop a cell which is capable of effectively photovoltaically converting a wide range in wavelength of light, thereby making it possible to achieve a higher photovoltaic conversion efficiency.

BRIEF SUMMARY OF THE INVENTION

Therefore, the object of the present invention is to provide a photovoltaic conversion element, which makes it possible to install it in the interior of a display element.

Another object of the present invention is to provide a photovoltaic conversion element available as a dye-sensitizing type electrochemical cell, which is capable of photovoltaically converting a wide range in wavelength of light with high photovoltaic conversion efficiency.

Still another object of the present invention is to provide a photovoltaic conversion element available as a dye-sensitizing type electrochemical cell, which does not require to employ a liquid electrolyte which may become a cause for the leakage of electrolyte, but is still capable of ensuring a higher photovoltaic conversion efficiency.

According to this invention, there is provided a photovoltaic conversion element comprising; a first transparent electrode, a transparent semiconductor layer disposed on the first transparent electrode, a sensitizing dye adsorption portion which is disposed on the surface of the transparent semiconductor layer, a carrier transport layer formed on the sensitizing dye adsorption portion, and a second transparent electrode disposed on the carrier transport layer; which is characterized in that;

the sensitizing dye adsorption portion comprises sensitizing dyes of plural kinds of color, which are adsorbed on a plurality of surface regions of the semiconductor layer.

According to this invention, there is also provided a multi-color dye-sensitizing transparent semiconductor electrode member comprising a transparent semiconductor layer, and a sensitizing dye adsorption portion formed at a surface of the transparent substrate; wherein the sensitizing dye adsorption portion contains sensitizing dyes of plural kinds of color which are adsorbed on a plurality of surface regions of the transparent semiconductor layer.

According to this invention, there is also provided a method of manufacturing a multi-color dye-sensitizing transparent semiconductor electrode member, the method comprising the steps of:

forming a transparent semiconductor layer on a transparent electrode;

performing an adsorption of sensitizing dyes of plural kinds of color on a plurality of surface regions of the transparent semiconductor layer; and irradiating ultraviolet rays on the surface of the transparent semiconductor layer, thereby allowing the sensitizing dye of predetermined portions of the surface of the transparent semiconductor layer to desorb therefrom.

According to this invention, there is further provided a display element comprising the aforementioned photovoltaic conversion element as a color filter.

According to this invention, there is further provided a photovoltaic conversion element comprising two or more photovoltaic cell units which are laminated along a light transmitting direction; wherein, the photovoltaic cell unit comprises a dye-sensitizing transparent semiconductor electrode disposed on a light incident side, a counter electrode formed of a transparent conductive layer and disposed away from the dye-sensitizing transparent semiconductor electrode, and a carrier transport layer sandwiched between the dye-sensitizing transparent semiconductor electrode and the counter electrode;

the dye-sensitizing transparent semiconductor electrode is constituted by a transparent electrode disposed on a transparent substrate, a transparent semiconductor layer formed on the transparent electrode, and a sensitizing dye which is adsorbed on the transparent semiconductor layer and contacted with the carrier transport layer; and the sensitizing dye adsorbed in the dye-sensitizing transparent semiconductor electrode of each photovoltaic cell unit differs in absorption wavelength from each other.

According to this invention, there is further provided a photovoltaic conversion element comprising;

a transparent substrate;

a photovoltaic conversion layer-laminated body formed on the transparent substrate; and an electrode connecting portion formed on an edge portion of the photovoltaic conversion layer-laminated body; wherein, the photovoltaic conversion layer-laminated body is composed of 2 or more photovoltaic conversion layers laminated with each other;

the photovoltaic conversion layer is composed of;

a first transparent electrode and a second transparent electrode which are faced to and spaced away from each other;

a transparent semiconductor layer formed on the first transparent electrode;

a solid carrier transport layer formed on the second transparent electrode; and a sensitizing dye which is adsorbed on the transparent semiconductor layer and contacted with the solid carrier transport layer;

and wherein, a roughness factor of the transparent semiconductor layer is not more than 100, and a thickness of the solid carrier transport layer is not more than 1 $\mu$m.

According to this invention, there is further provided a photovoltaic conversion element comprising;

a first dye-sensitizing transparent semiconductor electrode;

a second dye-sensitizing transparent semiconductor electrode disposed facing the first dye-sensitizing transparent semiconductor electrode; and a carrier transport layer sandwiched between the first dye-sensitizing transparent semiconductor electrode and the second dye-sensitizing transparent semiconductor electrode; wherein, the photovoltaic conversion layer-laminated body is composed of 2 or more photovoltaic conversion layers laminated with each other;

the first dye-sensitizing transparent semiconductor electrode is composed of a transparent electrode, a first transparent semiconductor layer formed on the transparent electrode and having a first conductivity type, and a first sensitizing dye adsorbed on the first transparent semiconductor layer and contacted with the solid carrier transport layer; and the second dye-sensitizing transparent semiconductor electrode is composed of an electrode, a second transparent semiconductor layer formed on the electrode and having a second conductivity type, and a second sensitizing dye adsorbed on the second transparent semiconductor layer and contacted with the solid carrier transport layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

This invention will be further explained in detail below. However, the following embodiments are not intended to limit the scope of this invention.

The photovoltaic conversion element according to this invention can be advantageously employed as a multi-color dye-sensitizing type solar cell.

Figure 1:
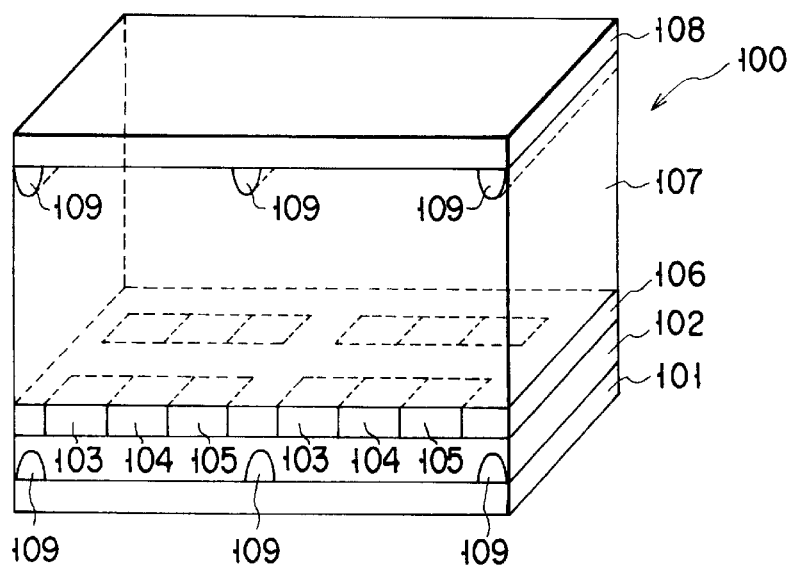
FIG. 1 is a schematic perspective view showing the construction of a multi-color dye-sensitizing type solar cell representing one embodiment of the photovoltaic conversion element according to this invention.

FIG. 1 shows a schematic perspective view of the construction of a multi-color dye-sensitizing type solar cell representing one embodiment of the photovoltaic conversion element according to this invention.

As shown in FIG. 1, the multi-color dye-sensitizing type solar cell 100 is composed of a first transparent electrode 101, a transparent semiconductor body 102 disposed on the first transparent electrode 101, sensitizing dye adsorption portions of four colors 103, 104, 105 and 106 which are adsorbed on the surface of the transparent semiconductor body 102, a carrier transport layer 107 formed on these sensitizing dye adsorption portions 103, 104, 105 and 106, and a second transparent electrode 108 disposed to face the first transparent electrode 101, etc. Further, auxiliary electrodes 109 are attached to the first transparent electrode 101 as well as to the second transparent electrode 108.

Figure 2:
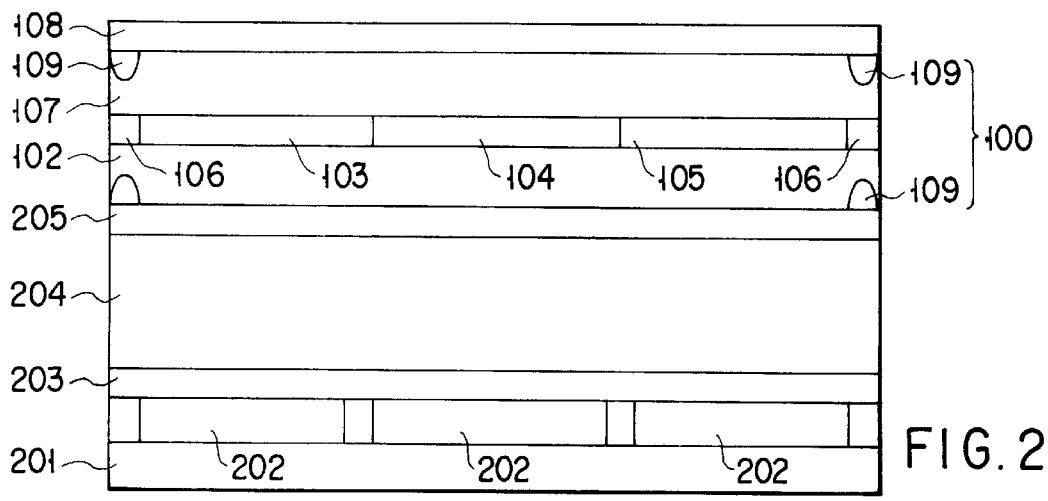
FIG. 2 is a cross-sectional view of one embodiment of a reflection type liquid crystal display element wherein a multi-color dye-sensitizing type solar cell representing a photovoltaic conversion element according to this invention is employed.

The multi-color dye-sensitizing type solar cell shown in FIG. 1 can be advantageously employed as a color filter of a reflection type liquid crystal display element. FIG. 2 shows a cross-sectional view of the construction of such a reflection type liquid crystal display element.

Referring to FIG. 2, a plurality of TFT circuits 202 each assigned for each pixel, and a scattering reflection pixel electrode 203 are formed on the surface of a substrate 201. A common electrode 205 is disposed, thus facing to and spaced away from the scattering reflection pixel electrode 203. A liquid crystal layer 204 is interposed between and supported by these couple of electrodes 203 and 205. The multi-color dye-sensitizing type solar cell 100 shown in FIG. 1 is disposed at the uppermost layer of the display element.

By the way, it is also possible to employ the first transparent electrode 101 and the second transparent electrode 108 of the multi-color dye-sensitizing type solar cell 100 as the common electrode 205 of the reflection type liquid crystal display element. In the embodiment shown in FIG. 2, the first transparent electrode 101 is employed as the common electrode 205.

The reflection type liquid crystal display element shown in FIG. 2 can be manufactured by the following procedures. First of all, the sensitizing dye to be employed for constituting the sensitizing dye absorption portion of the multi-color dye-sensitizing type solar cell will be explained.

As for this sensitizing dye, the compounds represented by the following general formula (1) can be employed.

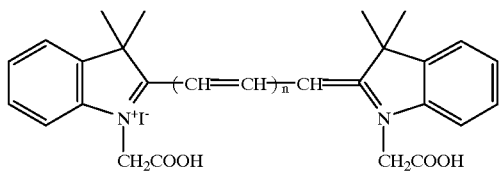

Specifically, when n in this general formula (1) is confined to 0, 1 and 2, a cyanine yellow sensitizing dye, a cyanine magenta sensitizing dye and a cyanine cyan sensitizing dye can be obtained respectively.

A red sensitizing dye can be obtained by mixing the cyanine yellow sensitizing dye and the cyanine magenta sensitizing dye at a molar ratio of 2:1. A green sensitizing dye can be obtained by mixing the cyanine yellow sensitizing dye and the cyanine cyan sensitizing dye at a molar ratio of 3:1. Further, a blue sensitizing dye can be obtained by mixing the cyanine magenta sensitizing dye and the cyanine cyan sensitizing dye at a molar ratio of 3:2.

As for black sensitizing dye, the dyes represented by the following general formula (2) can be employed.

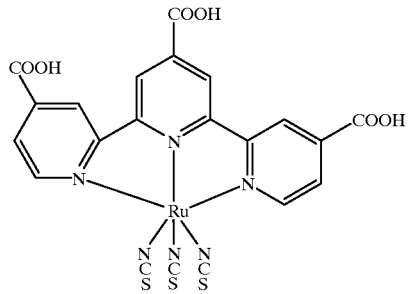

The multi-color dye-sensitizing type solar cell 100 shown in FIG. 1 can be manufactured by the following procedures.

First of all, about 2 mol/L of $TiCl_4$ is dissolved in ethanol, and then, methanol is further added thereto, thereby obtaining titanium alkoxide containing about 50 mg/mL of titanium. This titanium alkoxide is then hydrolyzed, and coated on the first transparent electrode 101 which has been vapor-deposited with platinum functioning as an auxiliary electrode 109. The resultant coated layer is then baked at a temperature of 400° C. for about 30 minutes to obtain a $TiO_2$ film to be functioned as the transparent semiconductor 102. In this case, the $TiO_2$ film should preferably be such that the roughness factor thereof is about 600 (when the surface thereof is turned into a rugged surface) in relative to the completely flat surface thereof, and the film thickness is 5 $\mu$m. The "roughness factor" is defined as the ratio of an actual/effective surface to the projected area of that surface of a body.

Then, the $TiO_2$ film is covered with a mask having openings which coincide only with a red sensitizing dye adsorption portion 103, and dipped into an ethanol solution of a red sensitizing dye. After three hours of dipping, the $TiO_2$ film is taken out of the solution, and washed with ethanol to thereby remove the mask. Thereafter, the $TiO_2$ film is covered with a mask having openings which coincide only with a green sensitizing dye adsorption portion 104, and dipped into an ethanol solution of a green sensitizing dye. After three hours of dipping, the $TiO_2$ film is taken out of the solution, and washed with ethanol to thereby remove the mask. Next, the $TiO_2$ film is covered with a mask having openings which coincide only with a blue sensitizing dye adsorption portion 105, and dipped into an ethanol solution of a blue sensitizing dye. After three hours of dipping, the $TiO_2$ film is taken out of the solution, and washed with ethanol to thereby remove the mask.

Finally, the $TiO_2$ film is dipped into an ethanol solution of a black sensitizing dye. After about three hours of dipping, the $TiO_2$ film is taken out of the solution, and washed with ethanol to thereby form the sensitizing dye absorption portions 103, 104, 105 and 106.

In the preparation of the carrier transport layer, acetonitrile containing $(C_3H_7)_4NI$ and $I_2$ at equimolar ratio and ethylene carbonate are mixed together at a volume ratio of about 20% and 80%, respectively to prepare an electrolyte. The resultant electrolyte is then interposed, together with polymer beads having a diameter of about 10 $\mu$m and functioning as a spacer, between the first transparent electrode 101 having the aforementioned sensitizing dye adsorbed therein and the second transparent electrode 108. Then, both sides of the resultant composite body are sealed with a resin, thereby obtaining a multi-color dye-sensitizing type solar cell portion.

On the other hand, as shown in FIG. 2, the TFT circuits 202 and the scattering reflection pixel electrode 203 are laminated on the surface of the substrate 201. Then, the substrate 201 and the first transparent electrode 101 of the multi-color dye-sensitizing type solar cell portion are employed as the common electrode 205 and for supporting the liquid crystal layer 204, thereby obtaining a reflection type liquid crystal display element having the aforementioned multi-color dye-sensitizing type solar cell portion as a color filter.

When the reflection type liquid crystal display element thus obtained was exposed to an irradiation of a pseudo-sun light having an intensity of about 75 mW/cm$^2$, this liquid crystal display element was found useful as a solar cell, exhibiting an energy conversion efficiency of about 6.5%.

As explained above, this reflection type liquid crystal display element equipped with the multi-color dye-sensitizing type solar cell is very useful not only as a display element but also as a solar cell.

Figure 3:
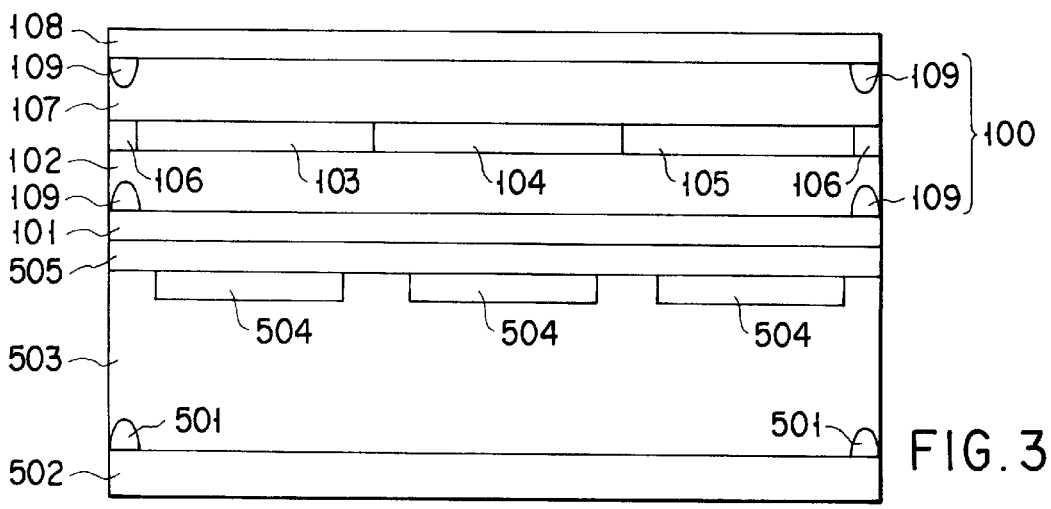
FIG. 3 is a cross-sectional view of one embodiment of an electrochromic display element wherein a multi-color dye-sensitizing type solar cell representing a photovoltaic conversion element according to this invention is employed.

FIG. 3 shows a cross-sectional view of one embodiment of an electrochromic display element wherein a multi-color dye-sensitizing type solar cell constituting a photoelectric element according to this invention is employed as a color filter. In this electrochromic display element shown in FIG. 3, a four color type multi-color dye-sensitizing type solar cell as shown in FIG. 1 is employed as a color filter.

The portions which are common to those of FIG. 1 are identified by the same marks as employed in FIG. 1, thereby omitting the explanation thereof.

In this electrochromic display element shown in FIG. 3, counter electrodes 501 are formed on the first transparent substrate 502, on which an electrochromic solution layer 503, a plurality of display electrodes 504 each assigned for each pixel, and a second transparent substrate 505 are successively laminated.

The first transparent electrode 101 of the multi-color dye-sensitizing type solar cell is connected with the second transparent substrate 505 of the electrochromic display element portion, thereby forming a multi-color dye-sensitizing type solar cell portion at the uppermost layer as in the case of FIG. 1. In the embodiment shown in FIG. 3, the first transparent electrode 101 is connected with the second transparent substrate 505. However, the second transparent electrode 108 may be connected with the second transparent substrate 505.

In the electrochromic display element shown in FIG. 3 can be manufactured as follows. The manufacturing method of the sensitizing dye of the multi-color dye-sensitizing type solar cell portion to be employed as well as of the $TiO_2$ film to be employed as the transparent semiconductor 102 on the first transparent electrode 101 may be the same as already explained above.

In the manufacture of the electrochromic display element, first of all, a $TiO_2$ film is dipped into an ethanol solution of a red sensitizing dye. After about one hour of dipping, the $TiO_2$ film is taken out of the solution, and washed with ethanol. Then, the resultant red sensitizing dye absorption portion is covered with a mask and exposed to an irradiation of ultraviolet rays having a wavelength of about 200 nm for about 30 minutes. Thereafter, the mask is removed and washed with ethanol to form a red sensitizing dye absorption portion 103.

The $TiO_2$ film having the red sensitizing dye absorption portion 103 formed as mentioned above is dipped into an ethanol solution of a green sensitizing dye for about one hour, after which the $TiO_2$ film is taken out of the solution and washed with ethanol. Then, the resultant green sensitizing dye absorption portion is covered with a mask and exposed to an irradiation of ultraviolet rays having a wavelength of about 200 nm for about 30 minutes. Thereafter, the mask is removed and washed with ethanol to form a green sensitizing dye absorption portion 104.

The $TiO_2$ film having the green sensitizing dye absorption portion 103 formed additionally as mentioned above is dipped into an ethanol solution of a blue sensitizing dye for about one hour, after which the $TiO_2$ film is taken out of the solution and washed with ethanol. Then, the resultant blue sensitizing dye absorption portion is covered with a mask and exposed to an irradiation of ultraviolet rays having a wavelength of about 200 nm for about 30 minutes. Thereafter, the mask is removed and washed with ethanol to form a blue sensitizing dye absorption portion 105.

Finally, the $TiO_2$ film is dipped into an ethanol solution of a black sensitizing dye. After about three hours of dipping, the $TiO_2$ film is taken out of the solution, and washed with ethanol to thereby form the black sensitizing dye absorption portions 106.

Thereafter, in the same manner as explained above, a multi-color dye-sensitizing type solar cell portion can be obtained.

On the other hand, counter electrodes 501 are formed on the first transparent substrate 502, on which an electrochromic solution layer 503, a plurality of display electrodes 504 and a second transparent substrate 505 are successively laminated. Further, the first transparent electrode 101 of the multi-color dye-sensitizing type solar cell portion is connected with the second transparent substrate 505, thereby accomplishing an electrochromic display element. This multi-color dye-sensitizing type solar cell is useful as a color filter.

When the electrochromic display element thus obtained was exposed to an irradiation of a pseudo-sun light having an intensity of about 75 $mW/cm^2$, this electrochromic display element was found useful as a solar cell, exhibiting an energy conversion efficiency of about 6.5%.

This electrochromic display element equipped with the multi-color dye-sensitizing type solar cell is useful not only as a display element but also as a solar cell.

Figure 4:
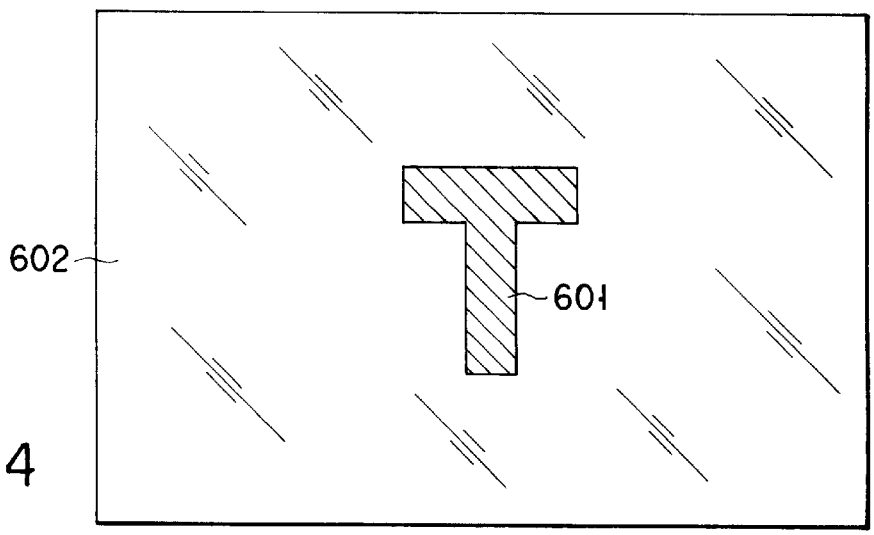
FIG. 4 is a plan view of an image-depicted glass body wherein a multi-color dye-sensitizing type solar cell representing a photovoltaic conversion element according to this invention is employed.

The multi-color dye-sensitizing type solar cell can be employed not only as a display element as mentioned above, but also in an image-depicted glass body. FIG. 4 shows one example of such an image-depicted glass body wherein a two color type multi-color dye-sensitizing type solar cell is employed.

Referring to FIG. 4, the multi-color dye-sensitizing type solar cell portion can be manufactured and constructed in the same manner as explained above. However, the pattern of the sensitizing dye differs from that explained above. Namely, by using a mask, sensitizing dyes are adsorbed respectively on the image 601 and the background 602. In this embodiment, a red sensitizing dye is employed for the image 601, and a blue sensitizing dye is employed for the background 602.

However, since there is no portion in the image-depicted glass body of FIG. 4 which does not permit light to pass therethrough, the auxiliary electrode 109 is not employed for any of the electrodes of the multi-color dye-sensitizing type solar cell.

When this image-depicted glass body equipped with the multi-color dye-sensitizing type solar cell was exposed to an irradiation of a pseudo-sun light having an intensity of about 750 $mW/cm^2$, the energy conversion efficiency thereof was found about 6.5%.

Therefore, this image-depicted glass body equipped with the multi-color dye-sensitizing type solar cell is useful also as a solar cell.

In the case of the conventional display device, a portion of light energy is absorbed by a color filter and converted into heat. However, since the multi-color dye-sensitizing type solar cell constituting a photovoltaic conversion element of this invention is employed as a color filter, the light energy can be photovoltaically converted, thereby enabling it available as an electric power. The display device to which the photovoltaic conversion element of this invention can be applied is not limited to a liquid crystal display element, but is also applicable to an electrochromic display element as shown in Japanese Patent Unexamined Publication H6-250233, and also to various display elements such as an EL display, a plasma display and a display employing a cathode-ray tube.

Further, by using the photovoltaic conversion element of this invention, an image such as picture or letter can be depicted on a glass body, thereby making it possible to employ the photovoltaic conversion element as a window, a sign board or a container, which is capable of supplying electric power.

In the foregoing explanations, the photovoltaic conversion element of this invention is illustrated taking the multi-color dye-sensitizing type solar cell as an example. However, the photovoltaic conversion element of this invention is not limited to the multi-color dye-sensitizing type solar cell, but can be used as a light sensor.

Next, each member to be employed in the photovoltaic conversion element of this invention will be explained in detail as follows.

The transparent electrode may be formed of a 2-ply structure, i.e. a transparent substrate and a transparent conductive layer formed on the transparent substrate.

As for the transparent substrate, glass, polymer film, etc. can be employed. As for the transparent conductive layer, tin oxide or lead oxide wherein fluorine, indium, aluminum, etc. is doped therein may be preferably employed. It is also possible to employ a transparent conductive layer which includes a very little quantity of opaque metal layer such as platinum, gold, silver, copper, aluminum, etc. as long as the quantity thereof would not substantially hinder the light transmittance of the transparent conductive layer.

In the foregoing embodiments, a transparent electrode is employed for both positive and negative electrodes of the multi-color dye-sensitizing type solar cell, and the transparent electrode is composed of a 2-ply structure, i.e. a transparent substrate and a transparent conductive layer. It is possible in the transparent electrode of the aforementioned construction to mount thereon an auxiliary electrode, thereby enhancing the conversion efficiency.

For example, when four colors of sensitizing dye, i.e. red, blue, green and black, are adsorbed on the surface of the transparent semiconductor, light hardly passes through the black portion. Therefore, the provision of an auxiliary electrode consisting of an opaque metal on this black portion would be effective in improving the conversion efficiency without giving any substantial influence to the external appearance of the black portion.

The auxiliary electrode should preferably be positioned, in the case of negative electrode, between a transparent semiconductor and a transparent electrode. When the transparent electrode is formed of a 2-ply structure, i.e. a transparent substrate and a transparent conductive layer, the auxiliary electrode should preferably be positioned between the transparent conductive layer and the transparent substrate. In the case of positive electrode, the auxiliary electrode should preferably be positioned on the surface of transparent electrode. When the transparent electrode is formed of a 2-ply structure, i.e. a transparent substrate and a transparent conductive layer, the auxiliary electrode should preferably be positioned between the transparent conductive layer and the transparent substrate.

As for the materials for the auxiliary electrode, a metal such as platinum, gold, silver, copper, aluminum, etc. or other kinds of highly conductive material such as graphite may be preferably employed.

In the photovoltaic conversion element of this invention, this sensitizing dye excited by light is caused to generate electrons at the LUMO level and holes at the HOMO level. The electrons of LUMO level of the sensitizing dye that have been generated by the excitation are immediately transferred to the conduction band of the transparent semiconductor, subsequently reaching the first transparent electrode. At this moment, since the holes are left remained at the HOMO level of the sensitizing dye, the carrier transport layer may be formed of a material which contains carriers which are capable of neutralizing this residual holes. As for the kind of carrier, it may be electron, hole or ion. As for the carrier transport layer, it may be a liquid material or a solid material.

As for the liquid ion transfer layer, it may be an iodide, a bromide, acetonitrile containing an ion carrier such as hydroquinone, ethylene carbonate or a mixture thereof can be preferably employed. As a specific example of the liquid material, an acetonitrile/ethylene carbonate mixed solvent electrolyte solution containing about 0.5 mol/L of tetrapropyl ammonium iodide, about 0.02 mol/L of potassium iodide, and about 0.03 mol/L of iodine may be employed.

As for the solid material, preferable examples thereof include a solid ion transfer material and a solid hole or electron transfer material.

As for the solid ion transfer material, it is possible to employ a gel electrolyte or a solid electrolyte having a salt such as sulfone imide salt, alkylimidazolium salt, tetracyanoquinodimethane salt or dicyanoquinodiimide on a side chain of a polymer such as polyethylene oxide or polyethylene. This gel electrolyte can be obtained by a process wherein a host polymer such as polyethylene oxide, polyacrylonitrile, polyvinylidene fluoride, polyvinyl alcohol, polyacrylatic acid or polyacryl amide is mixed with acetonitrile, ethylene carbonate, propylene carbonate or a mixture thereof, and the resultant mixture is subsequently polymerized.

As for the solid hole or electron transfer material, a crystalline or amorphous organic polymer can be employed.

As for the crystalline organic polymer, it is possible to employ a polycyclic aromatic compound such as perylene and coronene; metal phthalocyanine; perylene tetracarboxylic acid; a charge-transfer complex such as tetrathiafluvalene and tetracyanoquinodimethane.

As for the amorphous material, it is possible to employ aluminum quinodimethane or diamine having the following chemical structures.

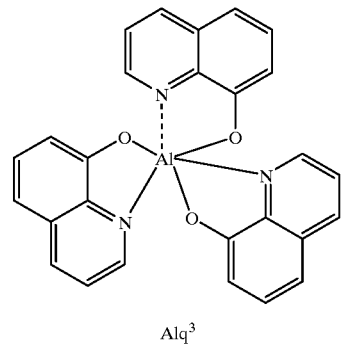

Alq$^3$

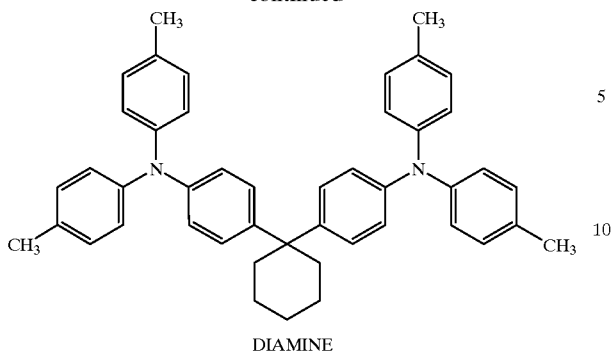

DIAMINE

Additionally, it is also possible to employ various kinds of oxadiazole as exemplified below, or other kinds of compound such as polypyrrole, polyaniline, poly N-vinyl carbazole, polyphenylene vinylene, etc.

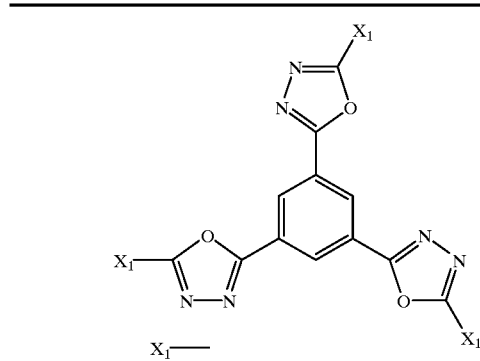

$X_1^-$

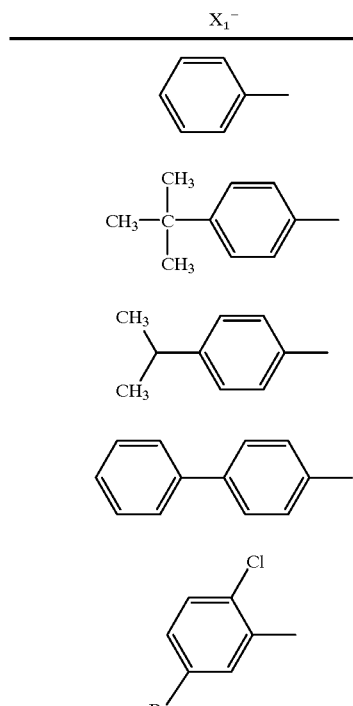

| | |
|---|---|
| (phenyl) | OXD-S0 |
| (CH3)3C-C6H4- | OXD-S1 |
| (CH3)2CH-C6H4- | OXD-S2 |
| biphenyl | OXD-S3 |
| 2-Cl, 4-Br phenyl | OXD-S4 |

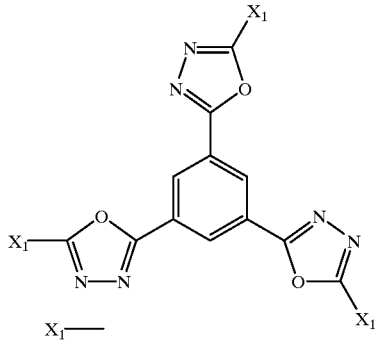

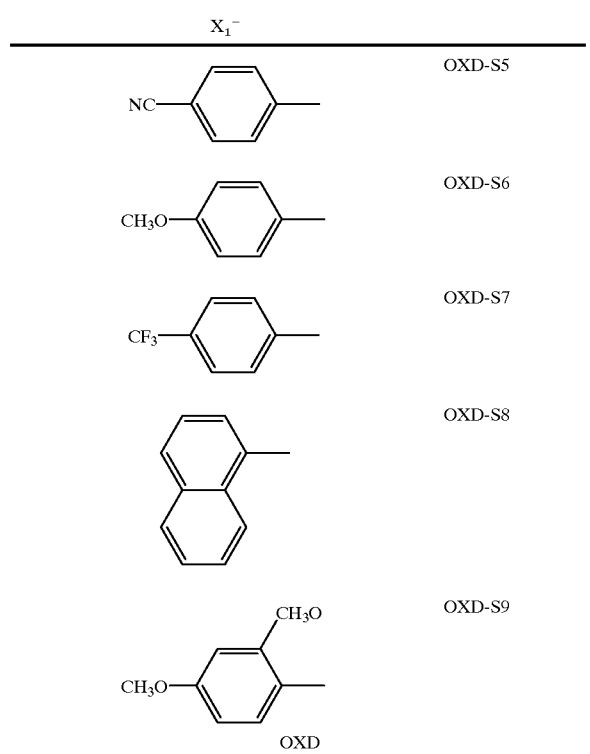

$X_1^-$

| | |
|---|---|
| NC-C6H4- | OXD-S5 |
| CH3O-C6H4- | OXD-S6 |
| CF3-C6H4- | OXD-S7 |
| naphthyl | OXD-S8 |
| 2,4-(CH3O)2 phenyl | OXD-S9 |

OXD

The sensitizing dye in the photovoltaic conversion element according to this invention is turned into an excited state upon absorbing an incident light, thereby delivering electrons to the transparent semiconductor, after which the holes in the carrier transport layer are neutralized. Therefore, the LUMO level of the sensitizing dye should be of the same or higher level as compared with the conductivity band level of the transparent semiconductor. On the other hand, the HOMO level of the sensitizing dye should be of the same or lower level as compared with the valence electron band level of the carrier transport layer or with the oxidation-reduction potential of ion of the carrier transport layer.

Further, the sensitizing dye may be selected from those having an adsorption site for enabling it to be strongly adsorbed on the transparent semiconductor. Preferably, the sensitizing dye should contain in the molecule thereof a functional group such as carboxylic group, hydroxyalkyl group, hydroxyl group, sulfone group, carboxylalkyl group, etc.

Specific preferable examples of the sensitizing dye are ruthenium-tris, ruthenium-bis, osmium-tris or osmium-bis type transition metal complex; polynucear complex; ruthenium-cis-diaqua-bipyridyl complex; phthalocyanine dye; polyphyline dye; perylene dye; anthraquinone dye; azo dye; quinophthalone dye; naphthoquinone dye; cyanine dye or merocyanine dye, to each of which any one of the aforementioned functional groups is attached.

The dye to be adsorbed as one color on each portion of the transparent semiconductor can be formed of a single kind of dye, or formed of a mixture of plural kinds of dye in order to obtain a desired color.

The color to be formed on the surface of the transparent semiconductor may be plural kinds of color, and a sensitizing dye which does not contribute to the photovoltaic conversion may be included in the sensitizing dyes to be employed. However, at least two kinds of color among the colors to be employed should be of the sensitizing dye which takes part in the function of photovoltaic conversion.

The adsorption of the dye to the transparent semiconductor can be performed by dipping the transparent semiconductor into a solvent dissolving the dye therein. In this dipping step, the solvent may be heated. If it is desired to allow two or more kinds of dye to be adsorbed on the same portion for the purpose of obtaining a desired color, a solution of the mixture of these dyes may be employed.

As for the mask to be employed for confining the location of adsorbing a dye on the surface of the transparent semiconductor, it may be manufactured by means of photolithography for instance. Further, if it is desired to decompose or remove a dye by way of irradiating ultraviolet rays, the ultraviolet rays can be irradiated by using lens for focusing the light or by using the method of scanning a laser beam on the surface of substrate.

As for the materials to be employed as the transparent semiconductor, it is preferable to employ a semiconductor which is minimal in absorption of visible light zone, or a metal oxide semiconductor such as oxides of transition metals. Specific examples of such metal oxide are oxides of titanium, zirconium, hafnium, strontium, zinc, indium, yttrium, lanthanum, vanadium, niobium, tantalum, chromium, molybdenum and tungsten; a composite oxide of these metals; or a mixture of these metal oxides. The metal oxide may be a perovskite such as $SrTiO_3$, $CaTiO_3$, $BaTiO_3$, $MgTiO_3$ and $SrNb_2O_4$, or a composite oxide or mixture of these perovskites. It is also possible to employ GaN.

The adsorption of sensitizing dye on the surface of transparent semiconductor can be effected to a thickness of several molecular layer at most. Therefore, for the purpose of adjusting the concentration of color, the surface of transparent semiconductor may be provided with a fine roughness so as to control the effective surface area, thereby making it possible to control the adsorption quantity of sensitizing dye per unit area. As for the structure of this roughness, a fine particulate structure may be adopted. For example, if a fine structure is to be formed by using a sintered body of $TiO_2$ fine particles having a particle diameter of about 10 nm for instance, the effective surface area can be controlled by adjusting the thickness of the fine particle layer.

Further, in order to prevent a dye contained in the transparent semiconductor covered with a mask pattern from moving toward the mask pattern thereby allowing the dye to exude to the outside of the mask pattern, a separator material may be introduced, at random or in a predetermined pattern, into the transparent semiconductor.

When the photovoltaic conversion element of this invention is employed as a multi-color dye-sensitizing solar cell, a color filter having a photovoltaic conversion function can be obtained. Therefore, when this color filter is employed as an actuating power source of display element in a display device, the following advantages can be obtained. Namely, without necessitating the provision of an auxiliary power source such as a solar cell on an external portion of the display element, the electric power to be supplied from a power source can be reduced, thereby achieving the energy saving of the device.

This color filter equipped with a photovoltaic conversion function can be employed in place of the conventional color filter. Moreover, the light energy that has been absorbed by a color filter and converted into heat in the case of the conventional color filter can be now made available for the photovoltaic conversion thereof. As a result, it becomes possible, according to the color filter of this invention, to supply an electric power without deteriorating the brightness or color reproducibility of picture plane.

The photovoltaic conversion element of this invention can be employed as a color glass exhibiting a multi-color pattern and provided with an added value of photovoltaic conversion function, or as a window, a sign board or a container, which is capable of displaying information such as picture or letter.

Next, the dye sensitized type photovoltaic cell constituting a photovoltaic conversion element of this invention will be explained.

In the case of the conventional photoelectric cell employing a monolayer of sensitizing dye, since it is impossible to absorb a light having a longer wavelength than the absorption wavelength of the sensitizing dye, the absorption wavelength of the sensitizing dye is shifted to a longer wavelength side, thereby making it possible to absorb the light of wider wavelength region. However, if such measurements are taken, only the light of low energy which is reduced due to such measurements could be utilized. Therefore, it is difficult, in the case of the conventional photoelectric cell, to further improve the photochemical conversion efficiency.

By contrast, according to this invention, the photovoltaic cell unit is constructed such that all of the member excluding the sensitizing dye, i.e. the transparent electrode, the transparent semiconductor layer, the carrier transport layer and the counter electrode are constituted by a transparent member. Two or more of this photovoltaic cell unit, each containing a sensitizing dye having a different absorption wavelength from each other, are then superimposed with each other along the light incident direction, thereby obtaining a laminate type photovoltaic cell. Since the photovoltaic cell is constructed in this manner, the light of various wavelengths in the incident light can be absorbed in the sensitizing dyes, thereby making it possible to achieve an effective photovoltaic conversion.

Figure 5:
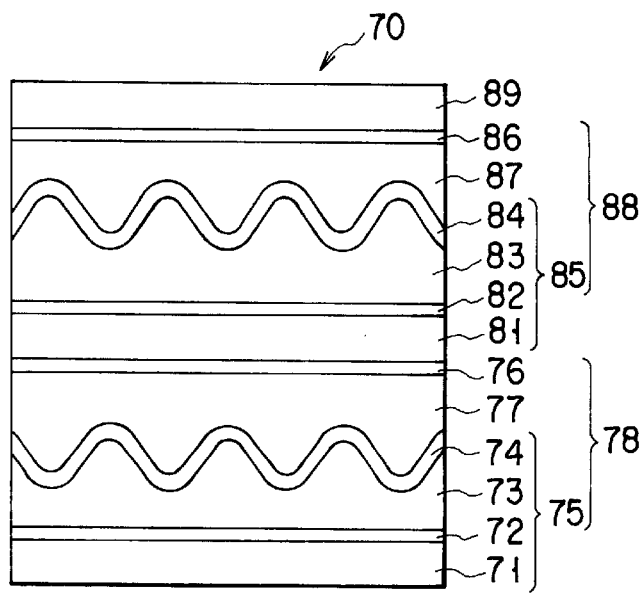
FIG. 5 is a cross-sectional view showing the construction of one embodiment of a first dye-sensitizing type photovoltaic cell constituting a photovoltaic conversion element according to this invention.

FIG. 5 shows a cross-sectional view of the construction of one embodiment of a first photovoltaic cell constituting a photovoltaic conversion element according to this invention.

Referring to FIG. 5, the photovoltaic cell 70 is constructed such that a first photovoltaic cell unit 78 and a second photovoltaic cell unit 88 are laminated along the transmitting direction of light. The first photovoltaic cell unit 78 is composed of a first dye-sensitizing transparent semiconductor electrode 75, a first counter electrode 76 and a first carrier transport layer 77 interposed between these electrodes 75 and 76. The second photovoltaic cell unit 88 is composed of a second dye-sensitizing transparent semiconductor electrode 85 and a second counter electrode 86 which is formed on a transparent substrate 89. Second carrier transport layer 87 is interposed between these electrodes 85 and 86. In each of these photovoltaic cell units 78 and 88, the dye-sensitizing transparent semiconductor electrode 75 or 85 is disposed on the light incident side.

The first dye-sensitizing transparent semiconductor electrode 75 of the first photovoltaic cell unit 78 is composed of a transparent electrode 72 and a transparent semiconductor layer 73, both being formed on a transparent substrate 71, and a first sensitizing dye 74 adsorbed on the transparent semiconductor layer 73. The second dye-sensitizing transparent semiconductor electrode 85 of the second photovoltaic cell unit 88 is also composed of a transparent electrode 82 and a transparent semiconductor layer 83, both being formed on a transparent substrate 81, and a second sensitizing dye 84 adsorbed on the transparent semiconductor layer 83.

As for these transparent electrodes, transparent semiconductors, carrier transport layers and counter electrodes employed for constituting this photovoltaic cell of this invention, they may be constructed in the same manner as explained above with reference to the photovoltaic conversion element.

However, it is required in the case of the photovoltaic cell shown in FIG. 5 that the absorption wavelength of sensitizing dye contained in the dye-sensitizing transparent semiconductor electrode of each photovoltaic cell unit differs from each other. Namely, the absorption wavelength of the first sensitizing dye 74 contained in the first dye-sensitizing transparent semiconductor electrode 75 of the first photovoltaic cell unit 78 differs from the absorption wavelength of the second sensitizing dye 84 contained in the second dye-sensitizing transparent semiconductor electrode 85 of the second photovoltaic cell unit 88.

Figure 6:
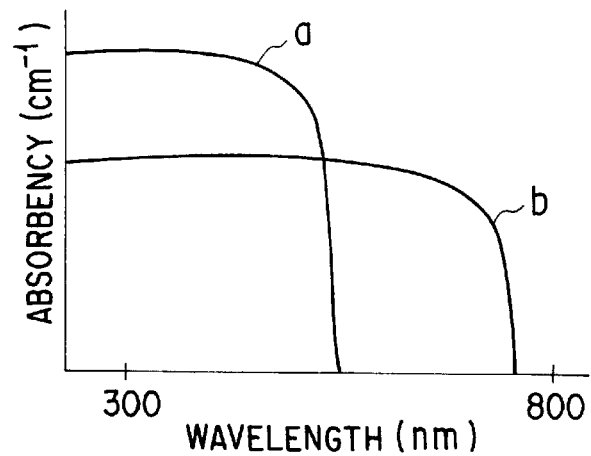
FIG. 6 is a graph illustrating the relationship between the absorption wavelength and absorbency of a sensitizing dye.

In order to realize a high conversion efficiency in the photovoltaic conversion of the light of wide range of wavelength in this photovoltaic cell shown in FIG. 5, the sensitizing dye in the layer which is located more remote from the light incident side should preferably be constituted by a dye exhibiting proportionately longer absorption wavelength. For example, if it is assumed that the light enters from the first photovoltaic cell unit 78 side, the sensitizing dye 74 located on the light incident side should preferably be designed to absorb a light which is shorter in wavelength than a light to be absorbed by the sensitizing dye 84 located remote from the light incident side, thereby allowing a light having a longer wavelength to transmit to the lower layers. FIG. 6 shows the relationship between the absorption wavelength of the sensitizing dye and the absorbency of the sensitizing dye in this embodiment. In FIG. 6, a curve "a" denotes the absorption spectrum of the sensitizing dye 74, and a curve "b" denotes the absorption spectrum of the sensitizing dye 84.

When it is desired to form a 3-ply structure by laminating a third photovoltaic cell unit on the second photovoltaic cell unit, the sensitizing dye of the second photovoltaic cell unit should preferably be designed to absorb a light which is longer in wavelength than a light to be absorbed by the sensitizing dye of the first layer but shorter in wavelength than a light to be absorbed by the sensitizing dye of the third layer, thereby allowing a light having a longer wavelength than that of the second layer to transmit to the third photovoltaic cell unit layer.

Figure 7:
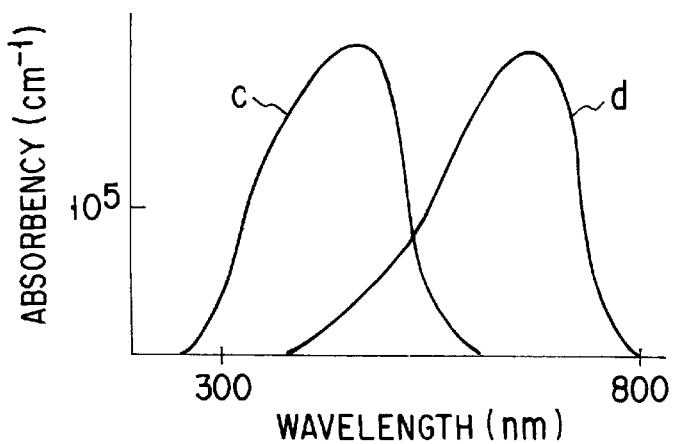
FIG. 7 is a graph illustrating the relationship between the absorption wavelength and absorbency of a sensitizing dye.

By the way, when it is desired to employ a plurality of sensitizing dyes each having no wavelength zone where the absorption coefficient thereof is not less than $10^5$ cm$^{-1}$, it is not absolutely necessary to determine the order of laminating the sensitizing dyes in accordance with the magnitude of absorption wavelength thereof. A specific example of such sensitizing dyes is shown in FIG. 7 wherein two kinds of sensitizing dye are shown, each exhibiting an independent absorption peak as represented by a curve "c" or an absorption peak represented by a curve "d" and having no overlapping at a visible light zone of about 300 to 1,200 nm in wavelength. When these sensitizing dyes are to be employed, the order of laminating each layer may not be restricted by the aforementioned regulation that the sensitizing dye in the layer which is located more remote from the light incident side should be constituted by a dye exhibiting proportionately longer absorption wavelength. Namely, even if each layer is laminated in a manner which does not agree with the aforementioned regulation, the sensitizing dye of each layer would be enabled to effectively absorb the light.

The employment of three kinds of sensitizing dye is more preferable than the structure employing two kinds of sensitizing dye. Namely, by using a laminate structure comprising a larger number of photovoltaic cell units where many a kind of sensitizing dyes are employed, the light of wider wavelength range would be enabled to be absorbed, thereby making it possible to achieve a higher photovoltaic conversion efficiency.

If a plurality of photovoltaic cell units, each having a sensitizing dye exhibiting a different absorption spectrum from each other, are to be laminated as mentioned above, the cells may be connected with each other in series if a high open-end voltage is intended, or may be connected with each other in parallel if a high short-circuit current is intended, since the open-end voltage and short-circuit current of each layer differ from each other.

According to this invention, since the photovoltaic cell is constituted by a laminate structure comprising a plural number of photovoltaic cell units laminated along the light transmitting direction and containing a plural kinds of sensitizing dyes having different absorption wavelength from each other, it is possible to enable the light of wider wavelength range to be photovoltaically converted at a higher conversion efficiency.

Next, the second dye sensitized type photovoltaic cell constituting a photovoltaic conversion element of this invention will be explained.

Since the electrolyte portion of the conventional photochemical cell is formed of a liquid, and since it is provided with a sufficient carrier diffusion constant, it is possible to achieve a high conversion efficiency even in the case of a cell having a thickness of 10 $\mu$m or more. However, the conventional photoelectric cell is accompanied with a problem of leakage of liquid from the cell.

By contrast, according to the second dye sensitized type photovoltaic cell of this invention, a solid carrier transport material is employed at the electrolyte portion, thereby overcoming the problem of liquid leakage and making it possible to achieve a high photovoltaic conversion efficiency. A defect of the solid carrier transport material that the carrier diffusion constant is low is compensated by minimizing the distance between the electrodes of each photovoltaic conversion layer and also minimizing the thickness of each photovoltaic conversion layer. Furthermore, since the cell is formed of a multi-layer structure by taking advantage of the transparency of the constituent members excluding the sensitizing dye, it is possible to retain a sufficient quantity of adsorption of the sensitizing dye as a whole. Accordingly, it becomes possible to overcome the problem of the quantity of adsorption of the sensitizing dye due to the reduction in roughness factor of the transparent semiconductor owing to the thinning of the photovoltaic conversion layer. This second photovoltaic cell according to this invention is a kind of a multi-layer solid sensitizing type photovoltaic cell, and hence, it is possible to completely prevent the problem of liquid leakage and at the same time, to achieve a high photovoltaic conversion efficiency.

Figure 8:
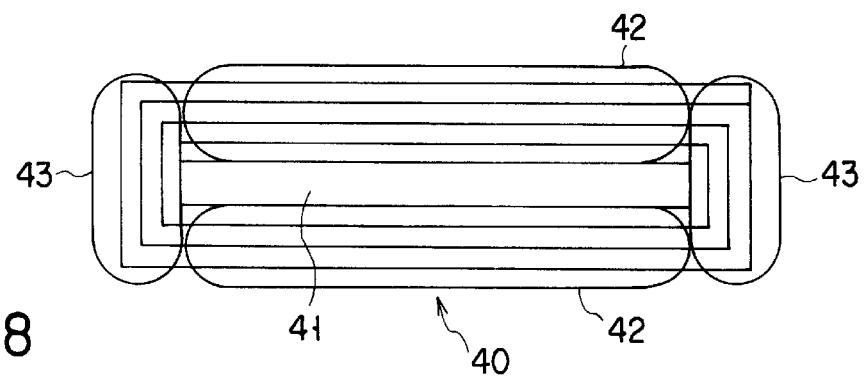
FIG. 8 is a schematic view illustrating the construction of one embodiment of a second dye-sensitizing type photovoltaic cell constituting a photovoltaic conversion element according to this invention.

FIG. 8 shows a schematic view illustrating the construction in section of one embodiment of the second photovoltaic cell according to this invention.

Referring to FIG. 8, the sensitizing type photovoltaic cell 40 shown therein comprises a transparent substrate 41, a photovoltaic conversion laminate 42 formed on the transparent substrate 41, and an electrode connecting portion 43 formed on an edge portion of the photovoltaic conversion laminate 42. This transparent substrate 41 functions to fasten the photovoltaic conversion laminate 42 and the electrode connecting portion 43. The photovoltaic conversion laminate 42 is constituted by a laminate of two or more photovoltaic conversion layers each having a positive electrode and a negative electrode. This photovoltaic conversion layer should preferably be formed of a 10 or more-ply laminate.

The photovoltaic conversion laminate functions to absorb a portion of the incident light through each photovoltaic conversion layer, thereby performing the photovoltaic conversion thereof, and to deliver the resultant electric charge to the positive electrode as well as to the negative electrode. Since the photovoltaic conversion laminate is formed of a multi-layered structure wherein a plurality of photovoltaic conversion layers are superimposed with each other, a structure where a plurality of positive and negative electrodes are respectively superimposed with each other will be obtained. The light which has failed to be absorbed by the photovoltaic conversion layer disposed on the incident side will be absorbed by the underlying photovoltaic conversion layer so as to be photovoltaically converted.

The electrode connecting portion 43 functions to connect the positive and negative electrodes of one photovoltaic conversion layer with the positive and negative electrodes of another photovoltaic conversion layer. As for the manner of connection, these photovoltaic conversion layers may be connected in series or parallel.

Figure 9:
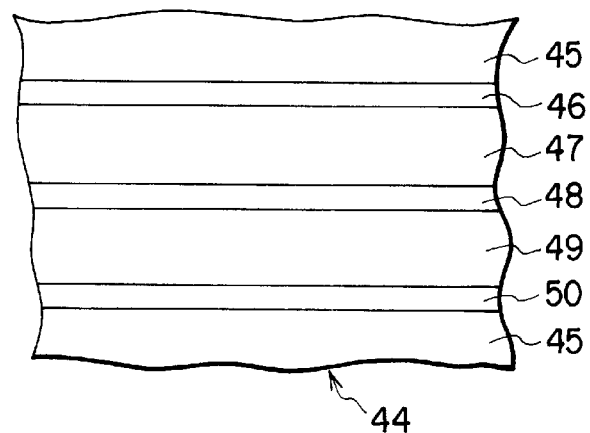
FIG. 9 is a cross-sectional view showing the construction of one embodiment of a photovoltaic conversion layer constituting the photovoltaic conversion laminate body of the dye-sensitizing type photovoltaic cell shown in FIG. 8.

Next, the specific structure of the photovoltaic conversion layer will be explained with reference with FIG. 9.

The photovoltaic conversion layer 44 comprises a first transparent electrode 46, a transparent semiconductor layer 47, a sensitizing dye 48, a solid carrier transport layer 49 and a second transparent electrode 50, which are sandwiched between a couple of transparent sheet cores 45. In order to deliver a carrier at a high speed, the sensitizing dye 48 is contacted with the transparent semiconductor layer 47 as well as with the solid carrier transport layer 49. The transparent sheet cores 45 are designed to support the aforementioned structure, but may be omitted as desired.

When a light is introduced into the photovoltaic conversion layer 44 from the first transparent electrode 46 side, the light is absorbed at first by the sensitizing dye 48. As a result, the sensitizing dye 48 is turned into an excited state, and then, delivers electrons to the transparent semiconductor layer 47, thus turning it into a state which is charged with positive charge. On the other hand, the solid carrier transport layer 49 functions to deliver electrons to the sensitizing dye 48 of positively charged state, thereby allowing the sensitizing dye 48 to return to the original state where light is not yet absorbed.

The electrons delivered to the transparent semiconductor layer 47 from the sensitizing dye 48 passes through the transparent semiconductor layer 47 and reaches the first transparent electrode 46. The carrier transport layer 49 which has delivered electrons to the sensitizing dye 48 is then rendered to receive electrons from the second transparent electrode 50, thereby allowing the carrier transport layer 49 to return to the original electrically neutral state. The electrons delivered to the first transparent electrode 46 is passed to an outside member through a lead wire. The second transparent electrode 50 is then rendered to receive electrons through a lead wire connected with an outside member. In this manner, the photovoltaic conversion is executed in each of the photovoltaic conversion layers, thus functioning as a solar cell.

In order to deliver electrons to the transparent semiconductor layer as fast as possible, the sensitizing dye should preferably be adsorbed on the surface of the transparent semiconductor layer 47. Since the absorption coefficient in visible region of the sensitizing dye is about $10^5$ cm$^{-1}$, it is impossible for the sensitizing dye to sufficiently absorb the light unless the sensitizing dye is deposited to a thickness corresponding to a 500-molecule layer or so, more preferably a 1,000-molecule layer or so. Therefore, in order to increase the quantity of sensitizing dye to be adsorbed per unit area of the transparent semiconductor layer, the surface of the transparent semiconductor layer 47 is required to be turned into a rugged surface, thereby increasing an effective surface area of the transparent semiconductor layer 47.

By the way, in the case of the conventional sensitizing type solar cell, it is required to form the transparent semiconductor layer to a thickness of at least 5 $\mu$m, if it is desired, with the employment of a single layer of transparent semiconductor layer, to realize a rugged surface structure corresponding to a roughness factor of about 1,000 as described above by using, for instance, a sintered body of TiO$_2$ fine particles 10 $\mu$m or so in particle diameter. The diffusion constant of liquid electrolyte is sufficiently large enough to allow a carrier to move between a sensitizing dye adsorbed on a rugged surface having a thickness of about 5 $\mu$m and a counter electrode. On the other hand, if a solid carrier transport material is to be employed, since the diffusion constant of solid carrier transport material is not sufficiently large, the thickness of 5 $\mu$m or so of the transparent semiconductor layer would become a cause for the deterioration of photovoltaic conversion efficiency. Since it is desired in the employment of a solid carrier transport material to confine the distance between electrodes to 1 $\mu$m or less, the thickness of the transparent semiconductor layer should preferably be confined to 1 $\mu$m or less. However, it is impossible to realize a roughness factor of 1,000 or so by using a single layer of transparent semiconductor having a thickness of as small as 1 $\mu$m or less.

It has been found by the present inventors that the conflicting problem between the reduction of thickness of cell due to a small carrier diffusion constant when a solid carrier transport material is to be used and the requirement of sufficient quantity of adsorption of sensitizing dye, i.e. the problem to be encountered in the employment of monolayer cell, can be overcome by the multi-layering of the transparent semiconductor layer. Since a plurality of photovoltaic conversion layers are laminated to form a multi-layered structure, the effective surface area of the transparent semiconductor layer which gives an influence to the quantity of adsorption of sensitizing dye becomes identical with the total of the roughness factor of the transparent semiconductor layer in every photovoltaic conversion layers through which an incident light can pass, so that it is sufficient if this total is 1,000 or more. Therefore, the roughness factor of the transparent semiconductor layer in each photovoltaic conversion layer is no more required to be as high as 1,000.

As shown in FIG. 8, the transparent semiconductor 47 carrying the sensitizing dye 48 is bonded via the solid carrier transport layer 49 to the transparent electrode 50. In the case of the conventional sensitizing type solar cell where a liquid electrolyte is employed is accompanied with the problems of liquid leakage or operation failure due to the evaporation of liquid electrolyte. On the other hand, in the case of the conventional solar cell where a conventional solid carrier transport material is employed is accompanied with the problem that since the diffusion constant of carrier is small, it is difficult to achieve a sufficient movement of the carrier, thus failing to achieve a high photovoltaic conversion efficiency.

According to this invention, all of the constituent members excluding the sensitizing dye are formed of a transparent material, and the distance between the electrodes of each photovoltaic conversion layer is made sufficiently small so as to enable the photovoltaic conversion to take place even if a solid carrier transport material is employed. Additionally, since photovoltaic conversion layers each constructed as mentioned above are laminated into a multi-layered structure, a sufficient quantity of sensitizing dye enabling it to absorb a sufficient quantity of light can be contained in the multi-layered structure as a whole. Therefore, it is now become possible to reduce the distance between electrodes in each photovoltaic conversion layer, and at the same time, to allow a predetermined quantity of sensitizing dye to be retained in the cell as a whole.

Figure 10:
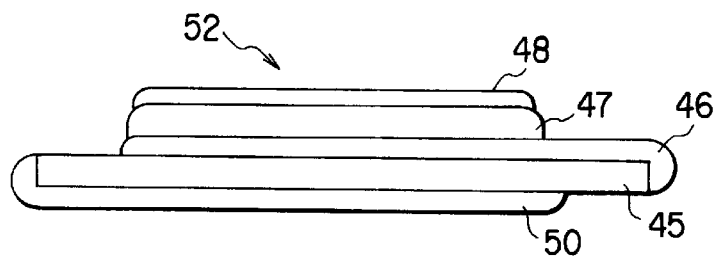
FIG. 10 is a schematic view showing the construction of one embodiment of a sensitizing cell electrode sheet to be employed for constituting the dye-sensitizing type photovoltaic cell shown in FIG. 8.

The second photovoltaic cell according to this invention and shown in FIG. 8 can be manufactured at low cost by using a roll process. In order to conveniently perform the roll process, it may be preferable to employ a method wherein a sensitizing cell electrode sheet 52 as shown in FIG. 10 for instance is to be wound around the transparent substrate 41.

In this case, the top and back surfaces of the transparent sheet core 45 are provided with the first transparent electrode 46 and the second transparent electrode 50, respectively. As for the material for this transparent sheet core 45, there is any particular limitation as long as it is formed of a flexible transparent insulating body. For example, glass or a polymer sheet such as PET sheet can be preferably employed.

As for the materials for the first transparent electrode 46 and the second transparent electrode 50 which are attached respectively to the top and back surfaces of the transparent sheet core 45, there is any particular limitation as long as it is formed of a conductive material exhibiting a low light absorption at the visible light zone. For example, a transparent conductive material (such as ITO or fluorine-doped tin oxide) as explained hereinabove in relative to the photovoltaic conversion element may be employed.

The first transparent electrode 46 and the second transparent electrode 50 constitute a positive electrode and a negative electrode, respectively, that will be employed on the occasion of actuating the sensitizing type photovoltaic cell shown in FIG. 8. For the purpose of taking out lead wires from the positive electrode and the negative electrode, respectively, after the sensitizing cell electrode sheet 52 has been wound around the transparent substrate 41, the first transparent electrode 46 and the second transparent electrode 50 are biased respectively toward right and left sides of the top and bottom surfaces of the transparent sheet core 45. Namely, in the case of the sensitizing cell sheet 52 shown in FIG. 10, only the first transparent electrode 46 is exposed at one end portion of the top surface of the transparent sheet core 45, while only the second transparent electrode 50 is exposed at the other end portion of the bottom surface of the transparent sheet core 45. As a result, the photovoltaic cell after the step of rolling is constructed such that the positive electrode and the negative electrode are exclusively exposed at the right and left sides of the photovoltaic cell. Since these transparent electrodes which are positioned respectively on the top and bottom surfaces of the sheet are biased right and left in this manner, the electrodes can be easily taken out of the rolled cell.

Figure 11:
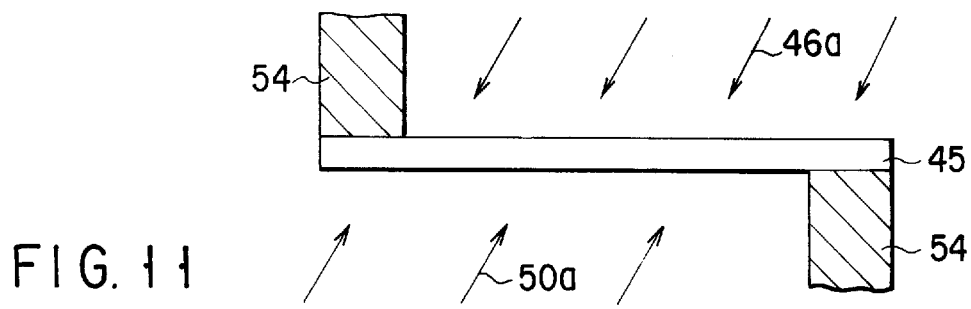
FIG. 11 is a schematic view illustrating one example of the manufacturing process of the photovoltaic cell shown in FIG. 8.

When these transparent electrodes 46 and 50 are to be formed in this manner on both surfaces of the transparent sheet core 45, transparent electrode materials 46a and 50a should be vapor-deposited on the transparent sheet core 45 by applying these transparent electrode materials 46a and 50a from the top in a leftwardly inclined direction and from the bottom in a rightwardly inclined direction, respectively, as shown in FIG. 11. In this case, a barrier 54 should preferably be placed at one end portion of the top surface of the transparent sheet core as well as at the other end portion of the bottom surface of the transparent sheet core, thereby preventing the transparent electrode material from going toward the other surface of the transparent sheet core.

The transparent semiconductor layer 47 is formed on a predetermined region of the first transparent electrode 46 so as to obtain a laminate structure consisting of the first transparent electrode 50, the transparent sheet core 45, the first transparent electrode 46 and the transparent semiconductor layer 47. This transparent semiconductor layer 47 is a material for taking up electrons from the sensitizing dye 48, so that it can be constituted by a transparent material exhibiting a low absorption of the light of visible light zone as explained with reference to the photovoltaic conversion element.

This transparent semiconductor layer includes a depletion layer, the thickness of which should preferably be as small as possible. If this transparent semiconductor layer is formed of a fine particle structure, the thickness of the depletion layer should preferably be smaller than the particle diameter. As for the composition of the transparent semiconductor layer, it should preferably be constructed such that it includes a lot of oxygen defects, and is doped with a pentavalent metal ion such as tantalum and niobium. As for the carrier concentration of the transparent semiconductor layer, if it is too low, the conductivity the semiconductor layer would become too low, while if it is too high, the semiconductor layer would be colored, thereby badly hindering the light absorption of the sensitizing dye. Therefore, the carrier concentration should preferably be in the range of $10^{10}/cm^3$ to $10^{20}/cm^3$, more preferably $10^{19}/cm^3$.

The transparent semiconductor layer 47 is electrically connected with the first transparent electrode 46, so that the electrons extracted from the sensitizing dye 48 are delivered to the first transparent electrode 46. Further, the surface of the transparent semiconductor is electrically connected with the sensitizing dye. For the purpose of allowing the surface of the transparent semiconductor to be contacted with as much quantity of sensitizing dye as possible per unit area of the sensitizing cell electrode sheet 52, the surface of the transparent semiconductor layer 47 should preferably be of rugged surface, thereby increasing the roughness factor thereof. For example, in a case where 100 layers of the sensitizing cell electrode sheet are disposed inside the sensitizing type solar cell, the roughness factor of the transparent semiconductor layer in each sensitizing cell electrode sheet should preferably be 10 or more. However, if it is desired to enlarge the roughness factor by using only one layer, the thickness of each transparent semiconductor layer would inevitably be increased, thus requiring the increase in thickness of the solid carrier transport layer.

However, when the thickness of the solid carrier transport layer is increased, the internal resistance thereof is caused to increase proportionately, so that it is difficult to improve the photovoltaic conversion efficiency. If the photovoltaic conversion efficiency is to be enhanced, the roughness factor of the transparent semiconductor layer 47 in the sensitizing cell electrode sheet 52 constituting the second photovoltaic cell of this invention, i.e. the roughness factor of the transparent semiconductor layer 47 in the photovoltaic conversion layer 44 should preferably be in the range of 10 to 100, more preferably in the range of 10 to 20.

The sensitizing dye 48 is adsorbed on the surface of the transparent semiconductor layer 47 and absorbs an incident light, thereby turning it into an excited state, thus consequently delivering electrons to the transparent semiconductor layer 47. At the same time, the sensitizing dye 48 receives electrons from the solid carrier transport layer 49. Therefore, the LUMO level of the sensitizing dye is required to be the same with or higher than the conduction level of the transparent semiconductor. As for the sensitizing dye, the same materials as already explained with reference to the photovoltaic conversion element can be employed.

The sensitizing cell electrode sheet 52 constructed as explained above is wound around the transparent substrate 41 by means of the roller 56 while rendering the solid carrier transport layer 49 to be sandwiched between the transparent substrate 41 and the sensitizing cell electrode sheet 52, thereby obtaining the structure as shown in FIG. 8. As for the material for the transparent substrate, there is any particular limitation as long as it is formed of a transparent solid body. For example, glass or a polymer sheet such as PET sheet can be preferably employed.

The solid carrier transport material is solid in room temperature, but is turned into liquid at a temperature of melting point or more. The coating of the solid carrier transport material on the surface of the transparent semiconductor layer 47 should preferably be performed at a temperature of not less than the melting point of the solid carrier transport material and under a reduced pressure so as to achieve an excellent bonding thereof with the rugged surface of the transparent semiconductor layer 47. Further, even after the pressure is returned back to normal pressure, the solid carrier transport material coated should preferably be maintained at a temperature around the melting temperature thereof for several hours so as to wait for the solid carrier transport material to sufficiently permeate into the rugged surface structure of the transparent semiconductor layer 47.

By being windingly introduced between the sensitizing cell electrode sheets, the solid carrier transport material 49 is sandwiched between the transparent semiconductor layer 47 having a sensitizing dye adsorbed thereon and the second transparent electrode 50. The solid carrier transport layer 49 is designed to function to deliver electrons to the sensitizing dye 48 after the sensitizing dye 48 turned into an excited state through the absorption of an incident light has delivered electrons to the transparent semiconductor layer 47. Subsequently, the solid carrier transport layer 49 receives electrons from the second transparent electrode 50. Therefore, when the solid carrier transport layer 49 employs a positive hole as a carrier, the HOMO level or valence band level should preferably be the same with or higher than the HOMO level of the sensitizing dye. On the other hand, when the solid carrier transport layer 49 employs an ion as a carrier, the oxidation-reduction potential of the ion should preferably be the same with or higher than the HOMO level of the sensitizing dye.

As for the material for constituting the solid carrier transport layer 49, a solid ion transport layer, and solid hole or electron transport material can be preferably employed. Specifically, among the materials of the carrier transport layer which are explained with reference to the photovoltaic conversion element, those which are of a solid material can be employed.

The solid carrier transport layer 49 is interposed between the second transparent electrode 50 and the transparent semiconductor layer 47 in order to deliver only holes or electrodes without causing the generation of a short circuit between the transparent semiconductor layer 47 carrying the sensitizing dye 48 and the second transparent electrode 50. Since the solid carrier transport material itself is incapable of exhibiting a sufficient carrier transport property, the thickness of the solid carrier transport material should preferably be as thin as possible. Specifically, the thickness of the solid carrier transport layer 49 in each photovoltaic conversion layer 44 should preferably be 1 μm or less. Further, for the purpose of adjusting the thickness of the solid carrier transport layer 49, an insulating spacer formed of glass or polymer may be incorporated in the solid carrier transport layer 49.

The electrodes are then led out of the sensitizing type photovoltaic cell manufactured as explained above. Namely, the first transparent electrode 46 and the second transparent electrode 50 which are exposed respectively at both end portions of the roll are respectively connected with a conductive paste 58 and then, attached to electrode plates 59 and 60, respectively, thereby manufacturing the multi-layered solid sensitizing type photovoltaic cell of this invention.

By the way, the second photovoltaic cell of this invention is not limited to the structure shown in FIG. 8. Namely, the second photovoltaic cell may be formed of a structure where the photovoltaic conversion laminate body 42 is disposed on one surface of the transparent 41. Moreover, the method of laminating each photovoltaic conversion layer is also not limited to the rolling process. The photovoltaic conversion laminate body comprising two or more of the photovoltaic conversion layer meeting the aforementioned conditions is then disposed on a predetermined surface of a transparent substrate, and attached with electrode portions, thereby obtaining the multi-layered solid sensitizing type photovoltaic cell of this invention.

In either of these constructions, the multi-layered solid sensitizing type photovoltaic cell constituting a photovoltaic conversion element of this invention is free from the problem of liquid leakage and is capable of exhibiting a high photovoltaic conversion.

Next, a third photovoltaic cell constituting a photovoltaic conversion element according to this invention will be explained.

This third photovoltaic cell according to this invention is a so-called tandem type photovoltaic cell wherein both of the positive electrode and negative electrode comprise respectively a transparent semiconductor layer and a sensitizing dye carried on transparent semiconductor layer. By the provision of the sensitizing dye on both of the positive electrode and negative electrode, the dyes on both sides are enabled to absorb an incident light, and hence, the energy that can be obtained by subtracting a loss to be brought about by the migration of carrier from the total energy to be obtained from the sum of the absorption wavelength components of both sensitizing dyes becomes a electromotive force. Whereas, according to the conventional dye sensitizing type photovoltaic cell, the transparent semiconductor and the sensitizing dye carried on the transparent semiconductor are employed only in the negative electrode, so that the electromotive force to be output is solely relied upon the absorption by this dye. By contrast, since the sensitizing dye is attached not only to the negative electrode but also to the positive electrode in this third photovoltaic cell, it is possible to obtain a higher open end electromotive force as compared with the conventional photoelectric cell where only a single dye is employed.

Figure 14:
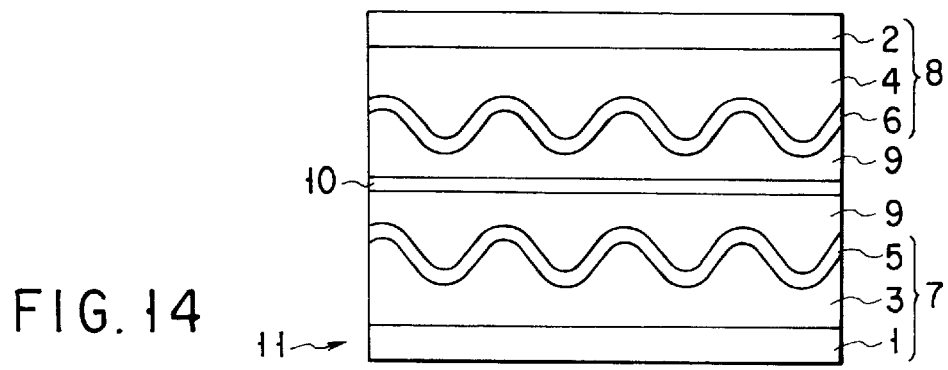
FIG. 14 is a schematic cross-sectional view illustrating the construction of one embodiment of a third dye-sensitizing type photovoltaic cell constituting a photovoltaic conversion element according to this invention.

FIG. 14 shows a schematic cross-sectional view illustrating the construction of one embodiment of this third photovoltaic cell according to this invention. The photovoltaic cell 11 shown in FIG. 14 composed of a first dye sensitizing transparent semiconductor electrode 7, a second dye sensitizing transparent semiconductor electrode 8, and a carrier transport layer 9 interposed between these dye sensitizing transparent semiconductor electrodes 7 and 8. In the embodiment shown in FIG. 14, a separator 10 is disposed in the carrier transport layer 9. However, this separator 10 is not necessarily required to be disposed therein.

The first dye sensitizing transparent semiconductor electrode 7 is constructed such that a first transparent semiconductor layer 3 and a first sensitizing dye layer 5 are successively formed on the surface of a first transparent electrode 1. On the other hand, the second dye sensitizing transparent semiconductor electrode 8 is constructed such that a second transparent semiconductor layer 4 and a second sensitizing dye layer 6 are successively formed on the surface of a second transparent electrode 2.

The energy level of each member which is required for the actuation of the aforementioned tandem type photovoltaic cell is as follows.

Namely, the HOMO level of the first sensitizing dye layer 5 should desirably be lower by a difference of 0.5 eV than the oxidation-reduction potential of ion in the carrier transport layer, conduction band or valence band. On the other hand, the LUMO level of the second sensitizing dye layer 6 should desirably be higher by a difference of 0.5 eV than the oxidation-reduction potential of ion in the carrier transport layer, conduction band or valence band.

Figure 15:
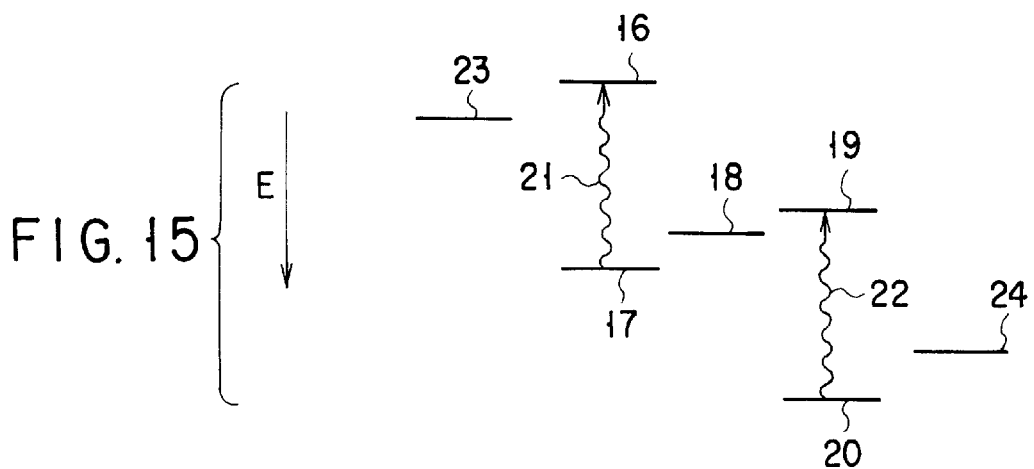
FIG. 15 is a diagram illustrating the energy level of a third dye-sensitizing type photovoltaic cell constituting a photovoltaic conversion element according to this invention.

FIG. 15 schematically shows the energy level of the aforementioned tandem type photovoltaic cell. Referring to FIG. 15, the reference numbers 16 and 17 show respectively the LUMO level and HOMO level of the first sensitizing dye, while the reference numbers 19 and 20 show respectively the LUMO level and HOMO level of the second sensitizing dye. The reference number 18 denotes the carrier level of the carrier transport layer, while the reference numbers 21 and 22 show the light absorption of the first sensitizing dye and of the second sensitizing dye, respectively.

The HOMO level of the first sensitizing dye should desirably be lower by a difference of 0.5 eV than the oxidation-reduction potential of ion in the carrier transport layer, conduction band or valence band. On the other hand, the LUMO level of the second sensitizing dye should desirably be higher by a difference of 0.5 eV than the oxidation-reduction potential of ion in the carrier transport layer, conduction band or valence band. The conduction band 23 of the first electrode should preferably be lower than the LUMO level 16 of the first sensitizing dye by a difference of 0.5 eV or less, more preferably 0.2 eV or less. Further, the valence band 24 of the second electrode should preferably be higher than the HOMO level 20 of the second sensitizing dye 2 by a difference of 0.5 eV, more preferably 0.2 ev or less.

This tandem type photovoltaic cell can be operated by the following process. Namely, the light entering from the first electrode 1 side reaches the first sensitizing dye layer 5 which is carried on the surface of the first transparent semiconductor layer 3, thereby exciting the sensitizing dye 5. As a result, where the first electrode 1 is a negative electrode, holes are caused to generate at the HOMO level of the sensitizing dye 5 due to the excitation of the sensitizing dye 5, and electrons are caused to generate at the LUMO level, the resultant electrons being allowed to move to the conduction band of the electrode 1.

The residual light that was failed to be absorbed by these electrode 1 and sensitizing dye 5 is allowed to pass through the carrier transport layer 9, thus reaching the second sensitizing dye 6 to excite this second sensitizing dye 6. As a result, electrons are caused to generate in this excited sensitizing dye 6 at the LUMO level, and holes are caused to generate at the HOMO level, the resultant holes being subsequently allowed to move to the valence band of the second electrode 2. The holes remaining at the HOMO level of the first sensitizing dye 5 and the electrons remaining at the LUMO level of the second sensitizing dye 6 are then neutralized through the carrier transport layer 9.

Owing to the electrons that have reached the first electrode 1 and to the holes that have reached the second electrode 2, the tandem type photovoltaic cell according to the first embodiment of this invention is actuated. The electromotive force of this tandem type photovoltaic cell corresponds to that can be obtained by subtracting a loss of energy due to the migration of carrier to each electrode from the difference between the LUMO level of the first sensitizing dye 5 and the HOMO level of the second sensitizing dye 6. In this case, the loss of energy can be defined to mean a factor to lower the open end voltage of a photovoltaic cell, such for example as the difference in level of electrons from each other as the carriers move between members such as the sensitizing dye and electrodes and an electric resistance as carriers move between members.

In the case of the conventional photoelectric cell where a single kind of sensitizing dye is employed, it is principally impossible to obtain an output which is higher than the energy of the absorption wavelength of the sensitizing dye. Even if it may be possible to increase the electromotive force by employing a dye which is shorter in absorption wavelength, the employment of such a dye is not so effective if the incident light is the sun light, because the quantity of incident light of short wavelength having a wavelength of not more than 400 nm is limited in the case of the sun light.

By contrast, in the case of the tandem type photovoltaic cell according to this invention as shown in FIG. 14, it is possible to increase the electromotive force up to the difference in energy between the LUMO level of the first sensitizing dye 5 and the HOMO level of the second sensitizing dye 6. On the other hand, the wavelength of the light to be absorbed includes the absorption wavelengths of the first sensitizing dye 5 and of the second sensitizing dye 6. Namely, according to this tandem type photovoltaic cell, while it employs a sensitizing dye having an absorption wavelength falling within a wavelength zone of 300 to 1,200 nm which is very strong in intensity in the sun light, it is still possible to generate an electromotive force which is larger than the electromotive force corresponding to the absorption wavelength of each sensitizing dye.

Next, the members constituting this third photovoltaic cell of this invention will be individually explained.

The first electrode 1 and second electrode 2 function respectively to receive electrons from the first sensitizing dye 5 and holes from the second sensitizing dye 6, and to deliver them to the exterior of the cell.

As for the structures of the first electrode 1 and second electrode 2, they should preferably be constructed individually such that one layer of n-type semiconductor and two layers of p-type semiconductor are deposited on a metal substrate. However, they may be constituted by only a metal layer.

It is preferable that the electrode disposed on the light incident side (the first electrode) among these electrodes is transparent. Because the incident light is required to reach, via the first electrode 1, to the carrier transport layer 9 interposed between a couple of the sensitizing layers 5 and 6. It is further desired that the electrode disposed remote from the light incident side is also transparent. Because, when the interfaces between the sensitizing layers 5 and 6 and the carrier transport layer 9 are constructed to have a minute rugged structure, it is required that the light is enabled to pass through the projected portion and reach the deep recessed portion in the fine structure.

As for the materials to be employed for these electrodes, the materials which are already explained with reference to the photovoltaic conversion element can be employed. However, it is desired in the case of this third photovoltaic cell of this invention that the electrode disposed on the light incident side is formed of a material which is minimal in light absorption in the visible light zone.

On the surface of the aforementioned first electrode 1, there is disposed a first semiconductor layer 3, and on the surface of the aforementioned second electrode 2, there is disposed a second semiconductor layer 4. One of these semiconductor layers is an n-type semiconductor, the other being a p-type semiconductor. Namely, there is no limitation as to which one of these semiconductor layers 3 and 4 should be an n-type semiconductor or a p-type semiconductor.

If a light is assumed to enter from the first transparent electrode 1 side into the cell, the first semiconductor layer 3 which is disposed nearer to the light source should be formed of a transparent semiconductor exhibiting minimal light absorption in the visible light zone. Because, for the purpose of photovoltaic conversion, an incident light is required to be enabled to reach the first sensitizing dye 5 and second sensitizing dye 6 through the semiconductor layer 3. Additionally, the second semiconductor layer 4 should also be formed of a transparent semiconductor exhibiting minimal light absorption in the visible light zone. Because, an incident light is required to be enabled to reach the second sensitizing dye 6 adsorbed on the surface of the fine rugged structure of the semiconductor layer 4 through the projected portions of the fine rugged surface of the semiconductor layer 4.

The materials that can be employed as such semiconductor layers should be selected from n-type or p-type semiconductors which exhibit minimal light absorption in the visible light zone. Specific examples of such semiconductors are those which are already explained with reference to the photovoltaic conversion element. In particular, $CuAlO_2$ is preferable as a transparent p-type semiconductor layer.

The surface of the semiconductor layer should preferably be formed to have a fine structure having a roughness factor of 10 or more. Specifically, the thickness of the fine structure should preferably be 10 μm or less, and the roughness factor of the fine structure should preferably be 20 times or more as high as that of the flat surface thereof. When the surface of the semiconductor layer is constructed in this manner, it is possible to enable the sensitizing dye to absorb an incident light at high efficiency even if a sensitizing dye exhibiting a low absorption coefficient is employed.

The first semiconductor layer 3 and second semiconductor layer 4 are provided respectively with a sensitizing dye adsorbed thereon.

This sensitizing dye can be formed on the surface of the semiconductor layer as a sensitizing dye layer as shown in FIG. 14. Alternatively, the sensitizing dye may be included in the semiconductor layer by using semiconductor fine particles which have been sensitized with a dye on the occasion of forming the semiconductor layer.

The first sensitizing dye 5 and second sensitizing dye 6 to be employed herein should preferably be selected to have a different absorption wavelength from each other. Specifically, the absorption peaks of these two sensitizing dyes in the wavelength zone of 300 to 1,200 nm should preferably differ from each other by 100 nm or more. Alternatively, it may be preferable that both of the absorption coefficients of these two wavelengths in the wavelength zone of 300 to 1,200 nm should not have a wavelength zone of $10^5$ $cm^{-1}$ or more. When these two sensitizing dyes are selected in this manner, even if these two sensitizing dye layers are superimposed in a direction perpendicular to the direction of incident light, the light of certain wavelength that has been failed to be absorbed by one sensitizing dye layer to be irradiated at first by the incident light can be subsequently enabled to be absorbed by the other sensitizing dye layer, so that it is now possible to effectively absorb the light by using these two sensitizing dye layers.

When two kinds of sensitizing dye differing in absorption wavelength are to be employed, these sensitizing dyes should preferably be arranged such that the layer of a sensitizing dye exhibiting a peak of absorption spectrum at a shorter wavelength is positioned on a side which is closer to the light source of incident light, while the layer of a sensitizing dye exhibiting a peak of absorption spectrum at a longer wavelength is positioned on the other side which is remote from the light source of incident light. When these sensitizing dye layers are arrange in this manner, the light of longer wavelength that has been failed to be absorbed by a sensitizing dye exhibiting an absorption peak of shorter wavelength can be subsequently enabled to reach the other sensitizing dye layer so as to be absorbed by this latter sensitizing dye layer. In this manner, the incident light can be effectively absorbed by these two sensitizing dyes.

As for the sensitizing dye, it is possible to employ those which are already explained with reference the photovoltaic conversion element. It is also possible to employ, as preferable examples, a polycyclic aromatic compound such as perylene tetracarboxylic acid and coronene; or a charge-transfer complex such as tetrathiafluvalene and tetracyanoquinodimethane.

A first dye-sensitizing transparent semiconductor electrode 7 is constituted by the first transparent electrode 1, the first transparent semiconductor layer 3, and the first sensitizing dye layer 5. On the other hand, a second dye-sensitizing transparent semiconductor electrode 8 is constituted by the second electrode 2, the second transparent semiconductor layer 4, and the second sensitizing dye layer 6. According to this third photovoltaic cell, the carrier transport layer 9 is interposed between these two dye-sensitizing transparent semiconductor electrodes 7 and 8.

There is any particular restriction regarding the carrier transport layer 9 as long as it is capable of transporting an electric charge between these sensitizing dye layers 5 and 6. In this case, the carrier for transporting an electric charge may be ion, electron or hole.

The thickness of the carrier transport layer 9 should preferably be as thin as possible. Specifically, the thickness of the carrier transport layer 9 should preferably be 10 $\mu$m or less, more preferably 5 $\mu$m or less. Namely, the thinner the carrier transport layer is, the more effectively the internal resistance can be inhibited, thereby making it possible to reduce the magnitude of the loss of electromotive force. Further, when the carrier transport layer is formed of an electrolyte, the leakage of liquid, if any, can be minimized. It becomes possible, by interposing a separator having a thickness of 5 $\mu$m or less between the first sensitizing dye layer 5 and the second sensitizing dye layer 6, to minimize the thickness of the carrier transport layer 9 without causing a short circuit to occur between the electrodes.

In particular, the carrier transport layer 9 should preferably be constructed to have a surface wherein the first sensitizing dye layer 5 and the second sensitizing dye layer 6 formed on both sides thereof are corresponding to each other. This corresponding structure set forth herein means a state wherein the projected portion of the first sensitizing dye layer 5 is corresponding to the recessed portion of the second sensitizing dye layer 6, or wherein the recessed portion of the first sensitizing dye layer 5 is engaged with the projected portion of the second sensitizing dye layer 6. When the first sensitizing dye layer 5 is corresponding to the second sensitizing dye layer 6 in this manner, the distance between the first sensitizing dye layer 5 and the second sensitizing dye layer 6 becomes uniform throughout the entire region, thus minimizing the thickness of the carrier transport layer 9. As a result, the loss of electromotive force to be brought about when the carrier migrates within the carrier transport layer 9 can be minimized. Further, even when the carrier transport layer is formed of a liquid, the leakage thereof can be minimized. Additionally, even in the case where the leakage is to be prevented by the employment of a gel or polymer in the preparation of the carrier transport layer, the thickness of the carrier transport layer can be reduced. Therefore, even in the case where a gel or polymer, which is lower in ion conductivity than an electrolyte, is employed, the loss of the photovoltaic conversion efficiency of the cell can be minimized.

As for the carrier transport layer to be employed in this third photovoltaic cell of this invention, those that have been already explained with reference to the photovoltaic conversion element can be employed.

The photovoltaic cell shown in FIG. 14 can be manufactured as explained below.

First of all, the first dye sensitizing transparent semiconductor electrode 7 composed of the first transparent electrode 1, the first transparent semiconductor layer 3 and the first sensitizing dye layer 5 is prepared. At the same time, the second dye-sensitizing transparent semiconductor electrode 8 composed of the second electrode 2 and the second transparent semiconductor layer 4 and the second sensitizing dye layer 6 is prepared. Then, the carrier transport layer 9 and the separator substance 10 are inserted into an interface between these dye-sensitizing transparent semiconductor electrodes 7 and 8.

Figure 16:
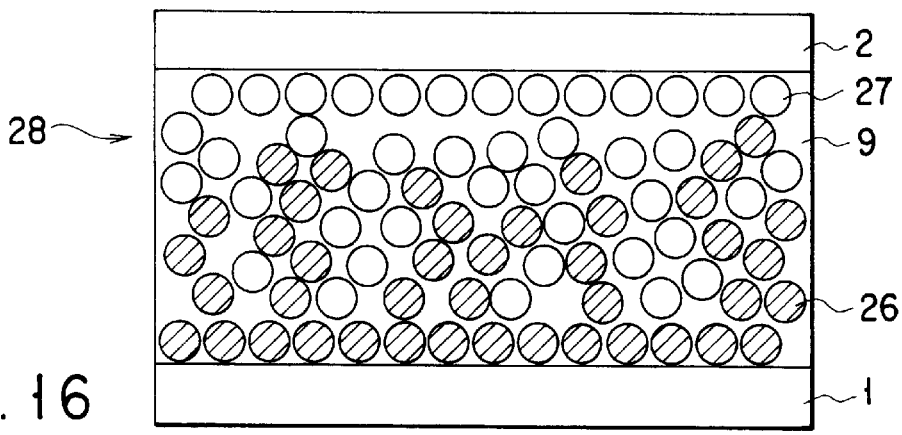
FIG. 16 is a schematic view illustrating the construction of another embodiment of a third dye-sensitizing type photovoltaic cell constituting a photovoltaic conversion element according to this invention.

These two transparent semiconductor layers each having an entangled rugged surface structure, which are to be employed in the third photovoltaic cell of this invention, can be manufactured by using two kinds of semiconductor fine particles carrying a sensitizing dye on the surface thereof. Namely, as shown in FIG. 16, a mixed layer comprising a first semiconductor fine particle 26 and a second semiconductor fine particle 27 is sandwiched between the first transparent electrode 1 and the second electrode 2, wherein the carrier transport layer 9 is interposed in a space between these semiconductor fine particles.

In the manufacture of the photovoltaic cell having the aforementioned construction, the first semiconductor fine particle 26 carrying the first sensitizing dye 5 on the surface thereof is mixed with the second semiconductor fine particle 27 carrying the second sensitizing dye 5 on the surface thereof, thereby obtaining a mixed layer of fine particles. In view of preventing the incident light from being scattered by the fine particles, the particle diameter of the semiconductor fine particles to be employed should preferably be 100 nm or less, more preferably 20 nm or less. The mixed layer of fine particles is then introduced, together with the material of the carrier transport layer 9, into an interface between the first transparent electrode 1 and the second electrode 2. Thereafter, a treatment for bonding both electrodes is performed.

Since these two kinds of fine particles are arranged at random due to the mixing of two kinds of semiconductor fine particles 26 and 27, the configuration of the interface formed between fine particles of two kinds would become very complicated. The mixed layer of semiconductor fine particles having such a complicated configuration can be employed as a couple of transparent semiconductor layers of the tandem type photovoltaic cell of this invention.

The aforementioned bonding treatment is a treatment for electrically bonding the semiconductor fine particles 26 or semiconductor fine particles 27, examples of which include a sintering treatment by way of heating, a short circuit bonding by the application of a high voltage, for instance.

In the case where fine particles are employed, the quantity of the carrier transport layer can be reduced as compared with the conventional photoelectric cell, since the complicated interface formed by the mixing of two kinds of semiconductor fine particle is utilized. As a result, when the carrier transport layer is formed of a liquid, the leakage thereof can be minimized. Further, even when the carrier transport layer is formed of a solid material exhibiting a low ion conductivity, the leakage can be prevented while making it possible to minimize the lowering of the photovoltaic conversion efficiency.

As explained above, according to the third photovoltaic cell of this invention, since two kinds of sensitizing dye layers having desirable absorption wavelengths and the HOMO and LUMO levels are disposed, it becomes possible to achieve a higher open end voltage and a higher photovoltaic conversion efficiency as compared with the conventional photoelectric cell.

Next, this invention will be further explained in details with reference to the following various examples.

EXAMPLE 1

First of all, $TiO_2$ fine particles 15 nm in particle diameter was allowed to suspend in water to prepare a suspension, which was then coated on the surface of a fluorine-doped tin oxide transparent electrode. Thereafter, the coated layer was baked at a temperature of 450° C. to obtain a $TiO_2$ film to be functioned as a transparent semiconductor layer. This $TiO_2$ film was found as having a film thickness of 10 $\mu$m and a roughness factor of 1,000. Then, this $TiO_2$ film was dipped into an ethanol solution of cis-bis(isothiocyanate)bis(2,2'-bipyridyl-4,4'-dicarboxylate) ruthenium employed as a sensitizing dye. The solution was heated to reflux for 30 minutes at a boiling temperature of the solution, thereby obtaining a first dye-sensitizing transparent semiconductor electrode 7.

On the other hand, $CuAlO_2$ fine particles 15 nm in particle diameter was allowed to suspend in water to prepare a suspension, which was then coated on the surface of a fluorine-doped tin oxide transparent electrode. Thereafter, the coated layer was baked at a temperature of 450° C. to obtain a $CuAlO_2$ film to be functioned as a transparent semiconductor layer. This $CuAlO_2$ film was found as having a film thickness of 10 μm and a roughness factor of 1,000. Then, this $CuAlO_2$ film was dipped into an ethanol solution of perylene diimide employed as a sensitizing dye. The solution was heated to reflux for 30 minutes at a boiling temperature of the solution, thereby obtaining a second dye-sensitizing transparent semiconductor electrode 8.

Further, acetonitrile containing $(C_3H_7)_4NI$ and $I_2$ at equimolar ratio and ethylene carbonate were mixed together at a volume ratio of about 20% and 80%, respectively to prepare an electrolyte. The resultant electrolyte was then interposed, together with polyolefin fine porous separator having a porosity of 50% and a film thickness of 10 μm, between the aforementioned first dye-sensitizing transparent semiconductor electrode and the second dye-sensitizing transparent semiconductor electrode. Then, both sides of the resultant composite body were sealed with a resin. Thereafter, lead wires were attached to the composite body, thereby obtaining a tandem type solar cell.

EXAMPLE 2

The electrolyte prepared in Example 1 was mixed with the same weight of $[(CH_2—CF_2)—(CH_2—CF(CF_3))]$ to prepare an electrolyte mixture. After being heated to a temperature of 200° C., the resultant electrolyte mixture was then interposed, together with a separator, between the first dye-sensitizing transparent semiconductor electrode and the second dye-sensitizing transparent semiconductor electrode. Then, the resultant composite body was allowed to cool down to room temperature. Other procedures were performed in the same manner as illustrated in Example 1, thereby obtaining a tandem type gel photovoltaic cell.

EXAMPLE 3

Tandem type cell by using a mixture of fine particles:

First of all, $TiO_2$ fine particles 15 nm in particle diameter was allowed to suspend in an ethanol solution of cis-bis (isothiocyanate)bis(2,2'-bipyridyl-4,4'-dicarboxylate) ruthenium employed as a sensitizing dye. The solution was heated to reflux for 30 minutes at a boiling temperature of the solution, thereby obtaining a first dye-sensitizing semiconductor fine particles 26.

On the other hand, $CuAlO_2$ fine particles 15 nm in particle diameter was allowed to suspend in an ethanol solution of perylene diimide employed as a sensitizing dye. The solution was heated to reflux for 30 minutes at a boiling temperature of the solution, thereby obtaining a second dye-sensitizing semiconductor fine particles 27.

On the other hand, a first transparent semiconductor electrode provided with a $TiO_2$ film having a film thickness of 1 μm and a second transparent semiconductor electrode provided with a $CuAlO_2$ film having a film thickness of 1 μm were prepared in the same manner as explained in Example 1. A mixture comprising the first and second dye-sensitizing semiconductor fine particles 26 and 27 (1:1 in weight) was then interposed between the aforementioned first transparent semiconductor electrode and the second transparent semiconductor electrode, the interposed semiconductor fine particles having a film thickness of 10 μm. Then, the resultant composite body was sintered at a temperature of 400° C., thereby obtaining a mixed layer of dye-sensitizing semiconductor fine particles.

Then, an electrolyte of the same kind as employed in Example 1 was allowed to impregnate into the mixed layer of dye-sensitizing semiconductor fine particles under a reduced pressure, thus forming a carrier transport layer. Both sides of the resultant composite body were then sealed with a resin. Thereafter, lead wires were attached to the composite body, thereby obtaining a fine particle-mixed tandem type photochemical solar cell.

EXAMPLE 4

The electrolyte prepared in Example 1 was mixed with the same weight of $[(CH_2—CF_2)—(CH_2—CF(CF_3))]$ to prepare an electrolyte mixture. After being heated to a temperature of 200° C., the resultant electrolyte mixture was then allowed to impregnate into the dye-sensitizing semiconductor fine particle layer under a reduced pressure. After this impregnation step, the composite body was allowed to cool down to room temperature. With respect to other procedures, the resultant composite body was treated in the same manner as illustrated in Example 3, thereby obtaining a fine particle-mixed tandem type photochemical solar cell.

EXAMPLE 5

First of all, as shown in FIG. 11, transparent electrode materials 46a and 50a were vapor-deposited on a transparent sheet core 45 having a barrier 54 formed on a predetermined region thereof by applying these transparent electrode materials 46a and 50a from the top in a leftwardly inclined direction as well as from the bottom in a rightwardly inclined direction, thereby forming a first transparent electrode 46 and a second transparent electrode 50 on the top surface and back surface of the sheet core, respectively.

Further, a transparent semiconductor layer 47 was formed by the following procedures on the surface of the first transparent electrode 46 which was formed on the transparent sheet core 45.

First of all, $TiCl_4$ was dissolved in ethanol to prepare a 2 mol/liter of ethanol solution. Thereafter, methanol was further added to the ethanol solution to obtain titanium alkoxide containing 50 mg/mL of titanium. This titanium alkoxide was then hydrolyzed and coated on the surface of the first transparent electrode 46, after which the coated layer was sintered at a temperature of 400° C. for 30 minutes to obtain a $TiO_2$ film to be functioned as a transparent semiconductor layer 47 as shown in FIG. 10. This $TiO_2$ film was found as having a film thickness of 0.2 μm and a specific area of 18.

Then, a transparent sheet having the transparent semiconductor layer 47 formed thereon was dipped into an ethanol solution of cis-bis(isothiocyanate)bis(2,2'-bipyridyl-4,41-dicarboxylate) ruthenium employed as a sensitizing dye. The solution was heated to reflux for 30 minutes at a boiling temperature of the solution, thereby allowing the sensitizing dye 48 deposited, in a state of monomolecular layer, on the surface of the transparent semiconductor layer 47.

As a result of these steps, it was possible to obtain a sensitizing cell electrode sheet 52 provided, as shown in FIG. 10, with the transparent sheet core 45, the second transparent electrode 50 formed on the back surface of the sheet core, the first transparent electrode 46 and the transparent semiconductor layer 47 both formed on the top surface of the sheet core, and the sensitizing dye 48 adsorbed on the surface of the transparent semiconductor layer 47.

Figure 12:
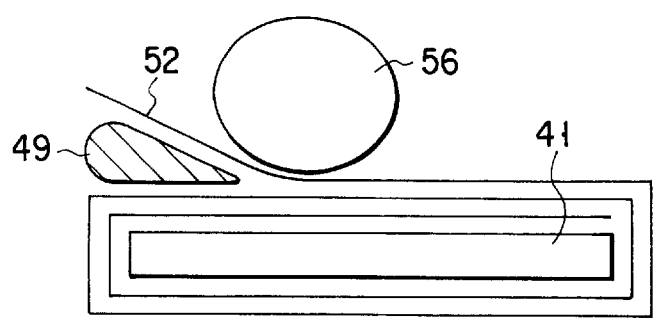
FIG. 12 is a schematic view illustrating one example of the manufacturing process of the photovoltaic cell shown in FIG. 8.

The sensitizing cell electrode sheet 52 thus obtained was wound 30 turns around the transparent substrate 41 while simultaneously entrapping the solid carrier transport material 49 therebetween as shown in FIG. 12. On this occasion, the thickness between the transparent semiconductor layer 47 and the second transparent electrode 50 was controlled to not more than 1 μm, and a glass spacer having a radius of 0.3 μm was mixed into the solid carrier transport material with a view to prevent the generation of electric short-circuit between the transparent semiconductor layer 47 and the second transparent electrode 50. After the manufacture of the cell, the thickness of each photovoltaic conversion layer was measured by means of a cross-sectional TEM, thus finding the thickness thereof as being 0.9±0.1 μm.

Figure 13:
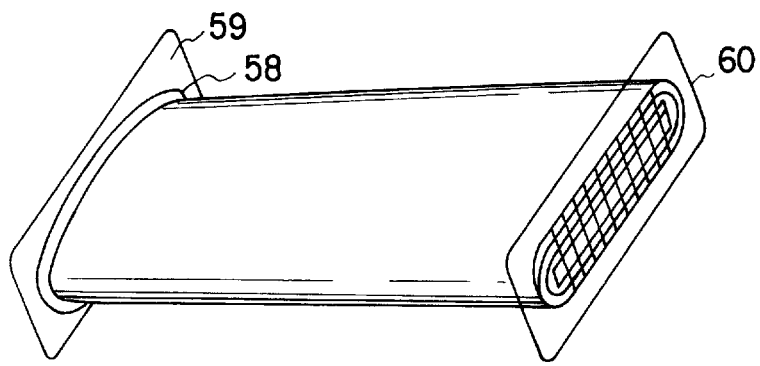
FIG. 13 is a perspective view showing one embodiment of a second dye-sensitizing type photovoltaic cell constituting a photovoltaic conversion element according to this invention.

Finally, electrodes were fabricated by way of the conductive paste 58 and the electrode plates 59 and 60, thus obtaining a multi-layer solid sensitizing type solar cell as shown in FIG. 13.

EXAMPLE 6

First of all, a dye-sensitizing transparent semiconductor electrode carrying a first sensitizing dye (ruthenium complex) thereon was prepared in the same manner as explained in Example 1, thereby obtaining a first dye-sensitizing transparent semiconductor electrode.

Further, a second dye-sensitizing transparent semiconductor electrode was prepared according to the same procedures as explained in Example 1 except that perylene diimide was substituted for the sensitizing dye. A transparent electrode was formed on the back surface of the second dye-sensitizing transparent semiconductor electrode by using a fluorine-doped tin oxide, thereby forming a first counter electrode.

Then, an electrolyte of the same kind as employed in Example 1 was interposed, together with polyolefin fine porous separator having a porosity of 50% and a film thickness of 10 μm, between the aforementioned first dye-sensitizing transparent semiconductor electrode and the second dye-sensitizing transparent semiconductor electrode to obtain a first carrier transport layer. Further, an electrolyte of the same kind as described above and other necessary constituent member were interposed between a glass substrate having an ITO electrode formed thereon as a second electrode and the aforementioned second dye-sensitizing transparent semiconductor electrode to obtain a second carrier transport layer. Then, both sides of the resultant composite body were sealed with a resin. Thereafter, lead wires were attached to the composite body, thereby obtaining a 2-ply type photovoltaic cell as shown in FIG. 5.

Figure 17:
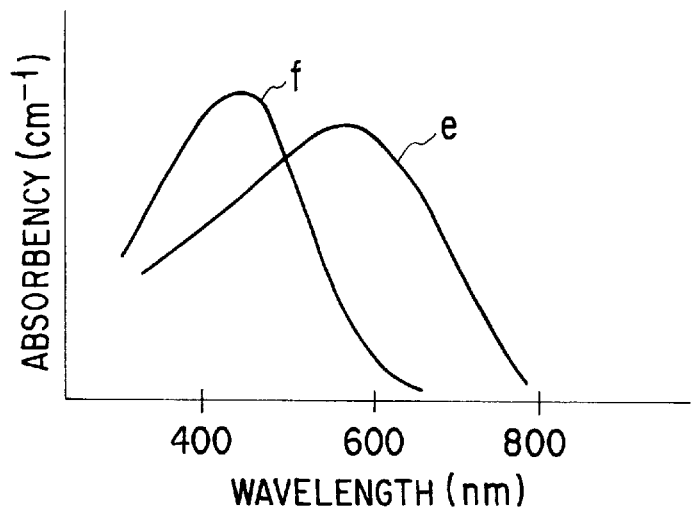
FIG. 17 is a graph illustrating the relationship between the absorption wavelength and absorbency of two kinds of sensitizing dye which are employed in a laminate sensitizing type photovoltaic cell of Example 6.

FIG. 17 shows the absorption spectra of the first and second sensitizing dyes employed herein. In FIG. 17, a curve "e" denotes the absorption spectrum of the ruthenium complex representing a first sensitizing dye carrying thereon a first dye-sensitizing transparent semiconductor electrode, and a curve "lf" denotes the absorption spectrum of the perylene diimide representing a second sensitizing dye carrying thereon a second dye-sensitizing transparent semiconductor electrode.

EXAMPLE 7

First of all, a dye-sensitizing transparent semiconductor electrode was prepared in the same manner as explained in Example 6 except that an anthraquinone-based yellow dye was substituted for the first sensitizing dye, and a second dye-sensitizing transparent semiconductor electrode was prepared in the same manner as explained in Example 6 except that an anthraquinone-based magenta dye was substituted for the second sensitizing dye. Further, a third dye-sensitizing transparent semiconductor electrode was prepared in the same manner as that of the second dye-sensitizing transparent semiconductor electrode except that an anthraquinone-based cyan dye was employed as a third sensitizing dye.

Then, a first carrier transport layer was formed between the aforementioned first dye-sensitizing transparent semiconductor electrode and the second dye-sensitizing transparent semiconductor electrode. Likewise, a second carrier transport layer was formed between the aforementioned second dye-sensitizing transparent semiconductor electrode and the third dye-sensitizing transparent semiconductor electrode. Further, an electrolyte of the same kind as described above and other necessary constituent member were interposed between a glass substrate having an ITO electrode formed thereon as a third electrode and the aforementioned third dye-sensitizing transparent semiconductor electrode to obtain a third carrier transport layer. Then, both sides of the resultant composite body were sealed with a resin. Thereafter, lead wires were attached to the composite body, thereby obtaining a 3-ply type photovoltaic cell as shown in FIG. 18.

Figure 18:
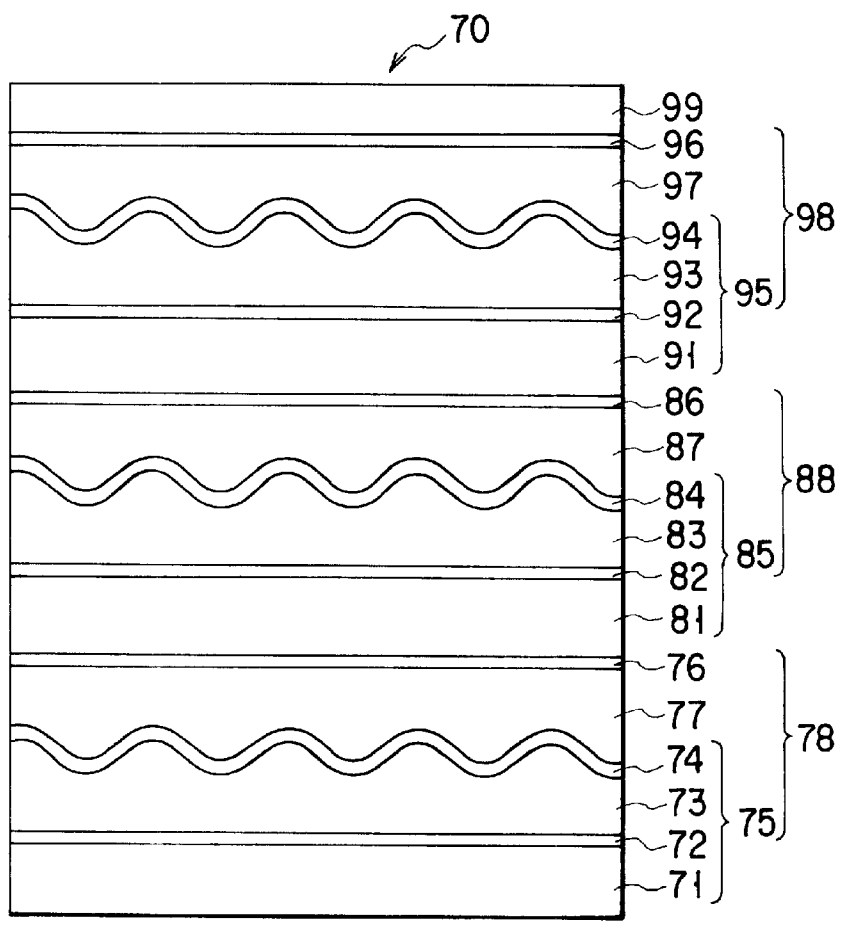
FIG. 18 is a schematic cross-sectional view illustrating the construction of another embodiment of a third dye-sensitizing type photovoltaic cell constituting a photovoltaic conversion element according to this invention.

The photovoltaic cell shown in FIG. 18 is of the same construction as that shown in FIG. 5 except that a third photovoltaic cell unit 98 is laminated on the second photovoltaic cell unit 88. Namely, in this third photovoltaic cell unit 98, a third carrier transport layer 96 was formed between a third counter electrode 97 formed on a glass substrate 99 and a third dye-sensitizing transparent semiconductor electrode 95 which was consisted of a transparent substrate 91, a transparent electrode 92, a transparent semiconductor layer 93 and a sensitizing dye 94.

In this example, an anthraquinone-based yellow dye was employed as a first sensitizing dye 74, an anthraquinone-based magenta dye was employed as a second sensitizing dye, and an anthraquinone-based cyan dye was employed as a third sensitizing dye.

Figure 19:
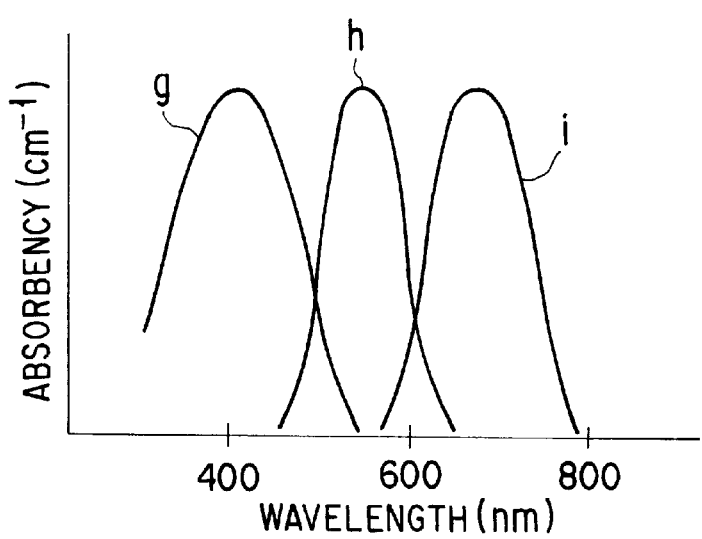
FIG. 19 is a graph illustrating the relationship between the absorption wavelength and absorbency of three kinds of sensitizing dye which are employed in a laminate sensitizing type photovoltaic cell of Example 7.

FIG. 19 shows the absorption spectra of these sensitizing dyes employed herein. In FIG. 19, a curve "g" denotes the absorption spectrum of the anthraquinone-based yellow dye, a curve "h" denotes the absorption spectrum of the anthraquinone-based magenta dye, and a curve "i" denotes the absorption spectrum of the anthraquinone-based cyan dye.

EXAMPLE 8

A 3-ply type photovoltaic cell was prepared in the same manner as explained in Example 7 except that an anthraquinone-based cyan dye was employed for the first sensitizing dye, and an anthraquinone-based yellow dye was employed as the third sensitizing dye.

As shown in FIG. 19, since the absorption spectrum of the anthraquinone-based yellow dye, the absorption spectrum of the anthraquinone-based magenta dye, and the absorption spectrum of the anthraquinone-based cyan dye have an independent peak, respectively, and furthermore, since these peaks are not overlapped at $10^5$ cm$^{-1}$, it is not necessary to change the order of laminating these sensitizing dye layers.

COMPARATIVE EXAMPLE 1

A dye-sensitizing transparent semiconductor electrode was prepared in the same manner as explained in Example 1, and a counter electrode was formed by vapor-depositing platinum on the surface of an ITO substrate.

Then, an electrolyte of the same kind as employed in Example 1 was interposed, together with a fine porous separator, between the aforementioned dye-sensitizing transparent semiconductor electrode and the counter electrode to obtain a composite body. Then, both sides of the resultant composite body were sealed with a resin. Thereafter, lead wires were attached to the composite body, thereby obtaining a photovoltaic cell of this Comparative Example.

COMPARATIVE EXAMPLE 2

The electrolyte prepared in Comparative Example 1 was mixed with the same weight of $[(CH_2-CF_2)-(CH_2-CF(CF_3))]$ to prepare an electrolyte mixture. After being heated to a temperature of 200° C., the resultant electrolyte mixture was then interposed, together with a separator, between a first dye-sensitizing transparent semiconductor electrode and a second dye-sensitizing transparent semiconductor electrode. Then, the resultant composite body was allowed to cool down to room temperature. Other procedures were performed in the same manner as illustrated in Comparative Example 1, thereby obtaining a gel photovoltaic cell.

The photovoltaic cells obtained in Examples 1 to 8 and Comparative Examples 1 and 2 were respectively exposed to a light irradiation having an intensity of about 750 mw/cm$^2$ by using a pseudo-sun light source (Wacom Co., Ltd.) thereby to measure the open-end voltage and photovoltaic conversion efficiency of these cells by using a source measure unit 236 (Keslay Co., Ltd.).

As for the photovoltaic cells of Examples 1 to 4 and 6 to 8, the open end voltage thereof was further measured. In particular, in the case of the photovoltaic cell of Example 6, these measurements were performed by connecting the electrodes of 2-ply photovoltaic cell units in series and in parallel.

First of all, the open- end voltage and photovoltaic conversion efficiency of the tandem type photovoltaic cells of Examples 1 to 4 and of the photovoltaic cells of Comparative Examples 1 and 2 will be summarized together with the materials of the carrier transport layer in the following Table 1.

TABLE 1

|  | Open end voltage (V) | Photovoltaic conversion efficiency (%) | Carrier transport layer |
| --- | --- | --- | --- |
| Example 1 | 1.2 | 15 | Liquid |
| Example 2 | 1.2 | 9 | Solid |
| Example 3 | 1.2 | 16 | Liquid |
| Example 4 | 1.2 | 14 | Solid |
| Comparative Example 1 | 0.7 | 7 | Liquid |
| Comparative Example 2 | 0.7 | 1 | Solid |

As seen from Table 1, since the tandem type photovoltaic cells of this invention (Examples 1 to 4) were provided with 2-ply structure of transparent semiconductor layer and of sensitizing dye layer, they indicated a higher open end voltage as compared with the conventional photoelectric cells. Further, when the carrier transport layer was formed of a solid body as in the case of the fine particle mixture-tandem type photovoltaic cells (Examples 3 and 4), this effect becomes more conspicuous.

Next, the photovoltaic conversion efficiency of the photovoltaic cells of Example 5 and of the photovoltaic cells of Comparative Examples 1 and 2 will be summarized together with the materials of the carrier transport layer in the following Table 2.

TABLE 2

| Cell | Carrier transport layer | Photovoltaic conversion efficiency (%) |
| --- | --- | --- |
| Example 5 | Solid | 10 (%) |
| Comparative Example 1 | Liquid | 7 (%) |
| Comparative Example 2 | Solid | 1 (%) |

As seen from Table 2, since the multi-layer solid sensitizing type solar cell of this invention (Example 5) was provided with a laminate of plural number of photovoltaic conversion layers, it indicated, in spite of the fact that a solid carrier transport layer was employed therein, a higher photovoltaic conversion efficiency as compared with the conventional sensitizing solar cells where a liquid electrolyte was employed.

Next, the open-end voltage and short-circuit current of the photovoltaic cells of Examples 6 to 8 and of the photovoltaic cell of Comparative Example 1 will be summarized together with the photovoltaic conversion efficiency thereof in the following Table 3.

TABLE 3

|  | Open end voltage (V) | Short circuit current (mA/cm$^2$) | Photovoltaic conversion efficiency (%) |
| --- | --- | --- | --- |
| Example 6 (connected in series) | 1.3 | 20 | 10 |
| Example 6 (connected parallel) | 0.7 | 30 | 10 |
| Example 7 | 1.5 | 20 | 12 |
| Example 8 | 1.5 | 20 | 12 |
| Comparative Example 1 | 0.7 | 20 | 7 |

As seen from Table 3, since the laminate sensitizing type photovoltaic cells of this invention (Examples 6 to 8) contained two or more kinds of sensitizing dyes, they indicated a higher photovoltaic conversion efficiency as compared with the conventional photoelectric cell.

As explained above, according to this invention, a photovoltaic conversion element which can be installed within the interior of a display element will be provided. Further, according to this invention, a photovoltaic conversion element available as a dye-sensitizing type electrochemical cell which is capable of photovoltaically converting a wide range in wavelength of light with a higher photovoltaic conversion efficiency will be provided.

Additionally, according to this invention, there will be provided a photovoltaic conversion element available as a dye-sensitizing type electrochemical cell which is capable of ensuring a higher photovoltaic conversion efficiency without requiring the employment of a liquid electrolyte which may become a cause for the leakage thereof. Moreover, according to this invention, there will be provided a photovoltaic conversion element available as a dye-sensitizing type electrochemical cell which is capable of achieving a higher electromotive force and a higher photovoltaic conversion efficiency.

Since the photovoltaic conversion element according to this invention is capable of photovoltaically converting an incident light energy with high photovoltaic conversion efficiency, the industrial value thereof will be enormous.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photovoltaic conversion element comprising:
   a first transparent electrode;
   a transparent semiconductor layer disposed on said first transparent electrode;
   a sensitizing dye adsorption portion disposed on a surface of said transparent semiconductor layer;
   a carrier transport layer formed on said sensitizing dye adsorption portion; and
   a second transparent electrode disposed on said carrier transport layer,
     wherein said sensitizing dye adsorption portion comprises sensitizing dyes of plural colors with a specific color sensitizing dye adsorbed on selected sites of a plurality of surface regions of said transparent semiconductor layer.

2. The photovoltaic conversion element according to claim 1, wherein said sensitizing dyes of plural colors are regularly disposed on the surface of said transparent semiconductor layer.

3. The photovoltaic conversion element according to claim 1, wherein at least one of said first transparent electrode and said second transparent electrode is provided with an auxiliary electrode.

4. The photovoltaic conversion element according to claim 1, wherein said photovoltaic conversion element is a multi-color dye-sensitizing solar cell.

5. The photovoltaic conversion element according to claim 1, wherein said sensitizing dyes of plural colors are disposed so as to indicate an image or letter.

6. The photovoltaic conversion element according to claim 1, wherein said sensitizing dyes of plural colors are disposed so as to form a color filter pattern, thereby enabling the photovoltaic conversion element to function as a color filter.

7. A photovoltaic conversion element comprising:
   at least two photovoltaic cell units laminated along a light transmitting direction, wherein a photovoltaic cell of said at least two photovoltaic cell units unit comprises:
     a dye-sensitizing transparent semiconductor electrode disposed on a light incident side,
     a counter electrode formed of a transparent conductive layer and disposed away from said dye-sensitizing transparent semiconductor electrode, and
     a carrier transport layer sandwiched between said dye-sensitizing transparent semiconductor electrode and said counter electrode, and
     wherein said dye-sensitizing transparent semiconductor electrode comprises:
       a transparent electrode disposed on a transparent substrate,
       a transparent semiconductor layer formed on said transparent electrode, and
       a sensitizing dye adsorbed on said transparent semiconductor layer and in contact with said carrier transport layer; and
     wherein each of said photovoltaic cells includes different sensitizing dyes such that a sensitizing dye adsorbed in a dye-sensitizing transparent semiconductor electrode of one photovoltaic cell unit differs in absorption wavelength from another sensitizing dye adsorbed in a dye-sensitizing transparent semiconductor electrode of another photovoltaic cell unit.

8. The photovoltaic conversion element according to claim 7, wherein said different sensitizing dyes comprise:
   a first sensitizing dye included in a photovoltaic cell unit located on the light incident side, and
   a second sensitizing dye included in a photovoltaic cell unit located on a side remote from said light incident side, and
     wherein the absorption wavelength of said first sensitizing dye is of a band which is shorter than the absorption wavelength of said second sensitizing dye.

9. The photovoltaic conversion element according to claim 8, wherein said first sensitizing dye is a ruthenium complex, and said second sensitizing dye is a perylene diimide.

10. The photovoltaic conversion element according to claim 8, wherein an absorption spectrum of said first sensitizing dye and an absorption spectrum of said second sensitizing dye have individual absorption peaks which are independent from each other and do not overlap with each other in a visible spectrum zone.

11. The photovoltaic conversion element according to claim 7, wherein said photovoltaic cell comprises:
   a first photovoltaic cell unit,
   a second photovoltaic cell unit, and
   a third photovoltaic cell unit, and
     wherein said first, second, and third photovoltaic cell units are arranged in the mentioned order along a direction of incident light, said first photovoltaic cell unit contains a first sensitizing dye, said second photovoltaic cell unit contains a second sensitizing dye, and said third photovoltaic cell unit contains a third sensitizing dye.

12. The photovoltaic conversion element according to claim 11, wherein said first sensitizing dye is a yellow dye, said second sensitizing dye is a magenta dye, and said third sensitizing dye is a cyan dye.

13. The photovoltaic conversion element according to claim 7, wherein said at least two photovoltaic cell units are connected in series.

14. The photovoltaic conversion element according to claim 7, wherein said at least two photovoltaic cell units are connected in parallel.

15. A photovoltaic conversion element comprising:
   a transparent substrate;
   a photovoltaic conversion layer-laminated body formed on said transparent substrate; and
   an electrode connecting portion formed on an edge portion of said photovoltaic conversion layer-laminated body,
     wherein said photovoltaic conversion layer-laminated body comprises at least two photovoltaic conversion layers laminated with each other and a photovoltaic conversion layer of said at least two photovoltaic conversion layers comprises:

a first transparent electrode and a second transparent electrode which are spaced away from and facing each other, a transparent semiconductor layer formed on said first transparent electrode, a solid carrier transport layer formed on said second transparent electrode, and a sensitizing dye adsorbed on said transparent semiconductor layer and in contact with said solid carrier transport layer, and wherein a roughness factor of said transparent semiconductor layer is not more than 100 and a thickness of said solid carrier transport layer is not more than 1 μm.

16. The photovoltaic conversion element according to claim 15, wherein said photovoltaic conversion layer is formed of at least a 10-ply laminate.

17. The photovoltaic conversion element according to claim 15, wherein the quantity of adsorption of said dye throughout said photovoltaic conversion element corresponds to a not less than 500-molecule layer.

18. The photovoltaic conversion element according to claim 15, wherein the quantity of adsorption of said dye throughout said photovoltaic conversion element corresponds to a not less than 1,000-molecule layer.

19. The photovoltaic conversion element according to claim 15, wherein the roughness factor of said transparent semiconductor layer is not less than 10.

20. The photovoltaic conversion element according to claim 15, wherein the roughness factor of said transparent semiconductor layer is in the range of 10 to 20.

21. The photovoltaic conversion element according to claim 15, wherein the carrier concentration of said transparent semiconductor layer is in the range of $10^{10}/cm^3$ to $10^{20}/cm^3$.

22. The photovoltaic conversion element according to claim 15, wherein the carrier concentration of said transparent semiconductor layer is $10^{19}/cm^3$.

* * * * *